United States Patent [19]

Barnsley et al.

[11] Patent Number: 5,602,862
[45] Date of Patent: Feb. 11, 1997

[54] OPTICAL CLOCK EXTRACTION

[75] Inventors: Peter E. Barnsley; Michael J. Robertson, both of Suffolk; Howard J. Wickes, Essex, all of England

[73] Assignee: British Telecommunications public limited company, London, England

[21] Appl. No.: 146,029

[22] PCT Filed: May 7, 1992

[86] PCT No.: PCT/GB92/00826

§ 371 Date: Nov. 8, 1993

§ 102(e) Date: Nov. 8, 1993

[87] PCT Pub. No.: WO92/20128

PCT Pub. Date: Nov. 12, 1992

[30] Foreign Application Priority Data

| May 7, 1991 | [GB] | United Kingdom | 9109824 |
| Jun. 10, 1991 | [GB] | United Kingdom | 9112432 |
| Feb. 28, 1992 | [GB] | United Kingdom | 9204299 |

[51] Int. Cl.$^6$ .................................................. H01S 3/19
[52] U.S. Cl. .................................. 372/45; 372/46; 372/50
[58] Field of Search .................................. 372/45, 46, 11, 372/50

[56] References Cited

U.S. PATENT DOCUMENTS

| 4,325,034 | 4/1982 | Dyment et al. | 372/50 |
| 4,562,569 | 12/1985 | Yariv et al. | 372/46 |
| 4,860,296 | 8/1989 | Chemla et al. | 372/46 |
| 4,897,844 | 1/1990 | Schimpe | 372/26 |
| 5,111,153 | 5/1992 | O'Mahoney et al. | 372/21 |
| 5,237,577 | 8/1993 | Keller et al. | 372/11 |
| 5,278,855 | 1/1994 | Veselka et al. | 372/11 |
| 5,297,158 | 3/1994 | Naitou et al. | 372/46 |
| 5,349,593 | 9/1994 | Lomashevitch | 372/50 |

FOREIGN PATENT DOCUMENTS

| 58202581 | 3/1984 | Japan . |
| 62245751 | 4/1988 | Japan . |
| 2052533 | 5/1990 | Japan . |
| 2105118 | 7/1990 | Japan . |
| 2126243 | 7/1990 | Japan . |
| 2183236 | 10/1990 | Japan . |

OTHER PUBLICATIONS

Jinno et al, "Optical Retiming Regenerator Using 1.5 mum Wavelength Multielectrode DFB LDs", vol. 25, No. 20, Sep. 1989 Electronics Letters, pp. 1332–1333.

Giles et al, "All–Optical Regenerator", Electronics Letters, vol. 24, No. 14, 7 Jul. 1988, pp. 848–850.

Primary Examiner—Rodney B. Bovernick
Assistant Examiner—Robert E. Wise
Attorney, Agent, or Firm—Nixon & Vanderhye P.C.

[57] ABSTRACT

In a high speed optical clock extraction arrangement, an incoming digital signal is divided between two paths (11, 25). The signal on one path (25) is fed direct to a receiver (203), while the signal on the other path (11) is fed to a non-linear optical amplifier (1) which has separate gain and absorbing regions. The non-linear optical amplifier (1) is triggered by the incoming signal to pulsate at a clock frequency contained in the signal, and the resultant strong output clock signal is coupled into the path (25) carrying the incoming signal to the receiver (203). The non-linear optical amplifier (1) can provide a very high frequency clock output as a result of selective modification of the carrier lifetime.

24 Claims, 16 Drawing Sheets

OPTICAL CLOCK EXTRACTION

FIELD OF THE INVENTION

The present invention relates to clock extraction, and in particular to clock extraction from digital optical signals.

BACKGROUND AND SUMMARY OF THE INVENTION

In return-to-zero (RZ) coding, the frequency spectrum of a coded signal will include a strong peak at the clock frequency. Clock extraction can then be achieved by filtering at the clock frequency and rectifying the result. However, this involves signal conversion to electronic form. It is much preferable to be able to extract the clock frequency by optical means.

Demand for broadband services (such as high quality data transfer, high definition television and video conferencing) may require telecommunications networks to operate with TBit/s capacities by the first decade of the next century. In order to meet this capacity demand, all-optical or "transparent" networks have been proposed, which networks employ either high speed optical time division multiplexing (OTDM) or wavelength division multiplexing (WDM) to attain the high data-rate. The transparent optical networks rely on optical switching and routing to maintain a transparent path between the source and destination nodes.

A transparent optical network may lie above the top electronic switched transport layer of a "synchronous digital hierarchy" (SDH). A synchronisation between the traffic on the transparent optical network and the switched transport layer is required for the transparent optical network to be compatible with the SDH. This can be achieved, for example by the use of optical switches at the intermediate network nodes, these switches requiring a clock synchronisation signal from incoming traffic, the synchronisation signal also being used for the demultiplexing of channels in an OTDM system.

The networks may also need to support services with a very broad range of bit-rates from 100 MBit/s (eg. video) to many Gbit/s (eg. multiplexed data). In order to maintain this network transparency, the clock extraction technique used needs to be flexible to bit-rate.

In transmission systems, electronic clock recovery circuits are generally used, conventional techniques using electronic filtering in the post detection circuitry. For instance, a high Q electrical filter may be used to extract the clock component in a received data modulation spectrum. The lack of tunable narrow bandpass electronic filters will, however, introduce an electronic "bottleneck" into the otherwise transparent network. If the modulation spectrum does not contain a clock component, such as in non-return to zero (NRZ) format data, then an additional electronic nonlinearity is needed to generate one. Within transparent optical network architectures, electronic clock recovery techniques are disadvantageous as they are bit-rate sensitive, require the tapping of the optical signal which results in power loss, and can also require wide band electronics.

Methods of all-optical clock extraction, particularly where the clock frequency can be tuned over a wide frequency range would be extremely useful.

The present invention is based on the use of a self-pulsating semiconductor laser. Such a device is known, the self-pulsation being caused by self Q-switching within the device caused by instabilities induced by regions of saturable absorption coupling with regions of high gain. The repetition rate of emitted pulses can be controlled by varying the current to either region of a two-region device, and has been found to vary approximately as $1/I^{1/2}$. In a paper entitled "Conditions for Self-Sustained Pulsation and Bistability in Semiconductor Lasers", J. Applied Physics, Vol 58, number 4, pp 1689–1692 (1985), M Ueno and R Lang have shown, by theoretical analysis, that self-pulsation only occurs at certain ratios of the carrier lifetimes, $\tau_g \tau_a$, and differential gain, $(\delta g_g \delta n)(\delta g_a \delta n)$, where the subscripts "g" and "a" refer to the gain and absorbing regions respectively, "g" is the material gain (or loss) and "n" is the carrier density. In general, pulsations are only likely to occur when the carrier lifetime ratio, $\tau_g/\tau_a$, is high. It is difficult to achieve this for InGaAsP material due to the high Auger coefficient which reduces the carrier lifetime in the gain region, $\tau_g$, for high carrier densities.

In a paper entitled "All-optical Timing Extraction using a 1.5 μm Self-Pulsating Multi-electrode DFB LD", Electronics Letters, Vol 24, number 23 pp 1426–1427 (1988), M Jinno and T Matsumoto have demonstrated optical clock extraction at relatively low data rates using self-pulsating laser diodes (SP-LDs). The pulsation frequency of the SP-LDs could be varied by about 10 MHz by changing the current applied to one of the sections.

To demonstrate clock recovery, they used RZ data at approximately 200 MBit/s by injecting about 250 μW of optical data into a SP-LD. They achieved clock recovery for input data patterns with up to 7 consecutive zeros. They noted that, at Multi-GHz operation, self-pulsate on is lost as the carrier density in the gain region of the device becomes so high that the consequent reduction in lifetime $\tau_g$ reduces the carrier lifetime ratio $\tau_g/\tau_a$. This is a complicated area, in that self-pulsation is affected by the ratio of $g_g/g_a$ as well as $\tau_g/\tau_a$. Increasing the reverse bias to control the gain ratio also increases the unsaturated absorption and increases $g_a$. Both these effects tend to move a device out of the self-pulsation regime into the bistable regime, resulting in weaker pulsations.

In embodiments of the present invention, not only can the problem indicated by Jinno be overcome but other, very significant, advantages can be achieved.

The aim of the invention is to provide a method and equipment for optical clock extraction which can operate at relatively high input data rates.

The present invention provides a semiconductor laser diode for use in an optical clock extraction system operating at high signal bit rates, the laser diode comprising a self-pulsating device having a region of saturable absorption coupling with a region of relatively high gain, the carrier lifetime in the saturable absorption region being lower that in the gain region.

Advantageously, the carrier lifetime in the saturable absorption region is selectively reduced with respect to that in the gain region.

Preferably, the carrier lifetime in the saturable absorption region is selectively reduced by selective diffusion of a dopant into the absorption region. In order to achieve said selective reduction of the carrier lifetime, it has been realised that selective doping with a component can be successfully used, for instance Zn doping. The Zn ions act as centres for non-radiative recombination, this reducing the carrier lifetime. Conveniently, the selective diffusion of dopant is carried out such that dopant is present in the active layer of the device but not in the material of the device between the active layer and an n-side electrical contact to the device.

Although this effect has been seen previously, in other contexts, as a disadvantage, an aspect of the present invention is to recognise its usefulness in a SP-LD for high frequency operation. More especially, it has been recognised that selective doping could and should be carried out, in the absorbing region only, and the exploitation of this idea has proved very successful. Indeed, it has been found that a single embodiment of the present invention can provide strong pulsation over a frequency range extending from about 3 GHz to 5.2 GHz, inclusive.

Although distributed feedback (DFB) laser diodes have been used in the past for clock extraction, because of their single mode output, and although Fabry-Perot devices do not generally have a single mode output, which would seem desirable in the present context, in practice it has been found that there is no significant problem in clock extraction in using Fabry-Perot devices. In embodiments of the present invention, the output of the Fabry-Perot device, once locked to an input optical clock component, is in general in a single dominant mode. Fabry-Perot devices also have the advantage that they are relatively simple to fabricate compared with DFB devices. Therefore, preferably, the laser diode comprises a Fabry-Perot structure.

It should be noted that, in the present application, a Fabry-Perot device is taken to be a device in which at least a significant proportion of optical feedback to a laser cavity is provided by a facet in the device structure. This is in contrast to a DFB device in which a significant proportion of optical feedback is provided over the length of the path of optical radiation in the device in use, such as is provided by a grating as commonly used in known DFB devices.

Generally, embodiments of the present invention are suitable for operation on any data having a significant clock component, such as RZ data.

In a preferred embodiment, the laser diode has a self-pulsation frequency of at least 5 GHz.

Advantageously, the laser diode further comprises frequency control means for controlling the self-pulsation frequency of the diode so that the self-pulsation frequency can be controllably varied over a frequency range. The frequency control means may comprise a variable gain current supply to a gain region of the diode.

Advantageously, the overall length of the diode lies in the range of from 250 µm to 500 µm, and the length of the saturable absorption region lies in the range of from 25 µm to 40 µm. In a preferred embodiment, the overall length of the diode is 500 µm, the overall length of the saturable absorption region is 25 µm, and said frequency range comprises at least the range of from 3.2 GHz to 5.2 GHz. Alternatively, the overall length of the diode is 250 µm, the length of the saturable absorption region is 40 µm, and said frequency range comprises at least the range of from 0.8 GHz to 3.5 GHz. The frequency range preferably covers a frequency change of at least 1 GHz and more preferably at least 2 GHz.

Preferably, the laser diode includes an active layer of a III–V compound having a direct bandgap, for example InGaAsP.

The invention also provides an optical clock extraction system comprising a self-pulsating laser diode whose output pulsation rate will lock onto a clock component of an input data signal over a significant range of frequencies of such a clock component, the range extending to a relatively high frequency, wherein the laser diode is as defined above. Preferably, said range extends to a frequency of the order of 5 GHz or greater. The system may be adapted for operation on digital optical input data having a significant clock component.

The invention further provides an optical signal processing system for processing an optical signal having a clock component, the system comprising means for inputting at least a portion of the optical signal to an optical clock extraction device, and means for inputting a clock output of the optical clock extraction device and at least a portion of the optical signal to an optical signal processing device which processes said optical signal by means of said clock output, wherein the optical clock extraction device is constituted by a laser diode as defined above.

Preferably, the clock output is combined with said at least a portion of the optical signal and the combination is supplied to an optical thresholding device.

In embodiments of the present invention, it is possible to use an opto-electronic device to extract a clock frequency from a digital optical signal, not only at the relatively low repetition rates of the order of 200 or 300 MHz, at which this has previously been done, but even at repetition rates of the order of 5 GHz and above. This means all-optical clock extraction can be carried out at data rates of 5 Gbit/s or even higher. Such clock extraction equipment could find major application in future all-optical high capacity networks.

Embodiments of the invention have shown quite surprisingly good operative characteristics, such as requiring input signal powers for successful clock extraction to be only of the order of 10 µW with stability over consecutive "zeros" in the input signals comparable to that which might be expected in practice, that is, of the order of or 31 consecutive "zeros". This number of "zeros" is quite likely to be present for real data where an incoming signal is for instance an OTDM signal.

Good operative characteristics which have been noted for specific embodiments of the invention can be listed as follows:

i) operation 25 times faster than known devices;

ii) 1/10th input optical signal power necessary compared with known devices;

iii) will operate over a wider wavelength range;

iv) better clock extinction ratio;

v) larger clock power;

vi) largely polarisation insensitive;

vii) operates with long "zero" trains; and viii) can operate at any clock frequency from 0.8 GHz to 5.2 GHz inclusive.

All-optical clock extraction techniques according to embodiments of the present invention may find application in both all-optical and opto-electronic regenerators, and in switch synchronising in future multi GBit/s optical submarine and terrestrial networks.

BRIEF DESCRIPTION OF THE DRAWINGS

An all-optical clock recovery system will now be described as an example of an embodiment of the present invention, with reference to the accompanying drawings, in which.

DETAILED DESCRIPTION OF THE DRAWINGS

Where reference is made to RF spectra in the present specificaton, this is reference to where an optical signal such as the output of the SP-LD, has been input to a photodiode having an electrical output, thus converting the SP-LD output to a baseband RF electrical signal. The optical signals concerned are generally at much too high frequencies for direct detection and recording. The baseband RF spectra, on the other hand, particularly the SP-LD output when converted, have upper frequencies of the order of 5 GHz and represent an "envelope" of the potentially THz optical frequencies concerned.

Figure 1:
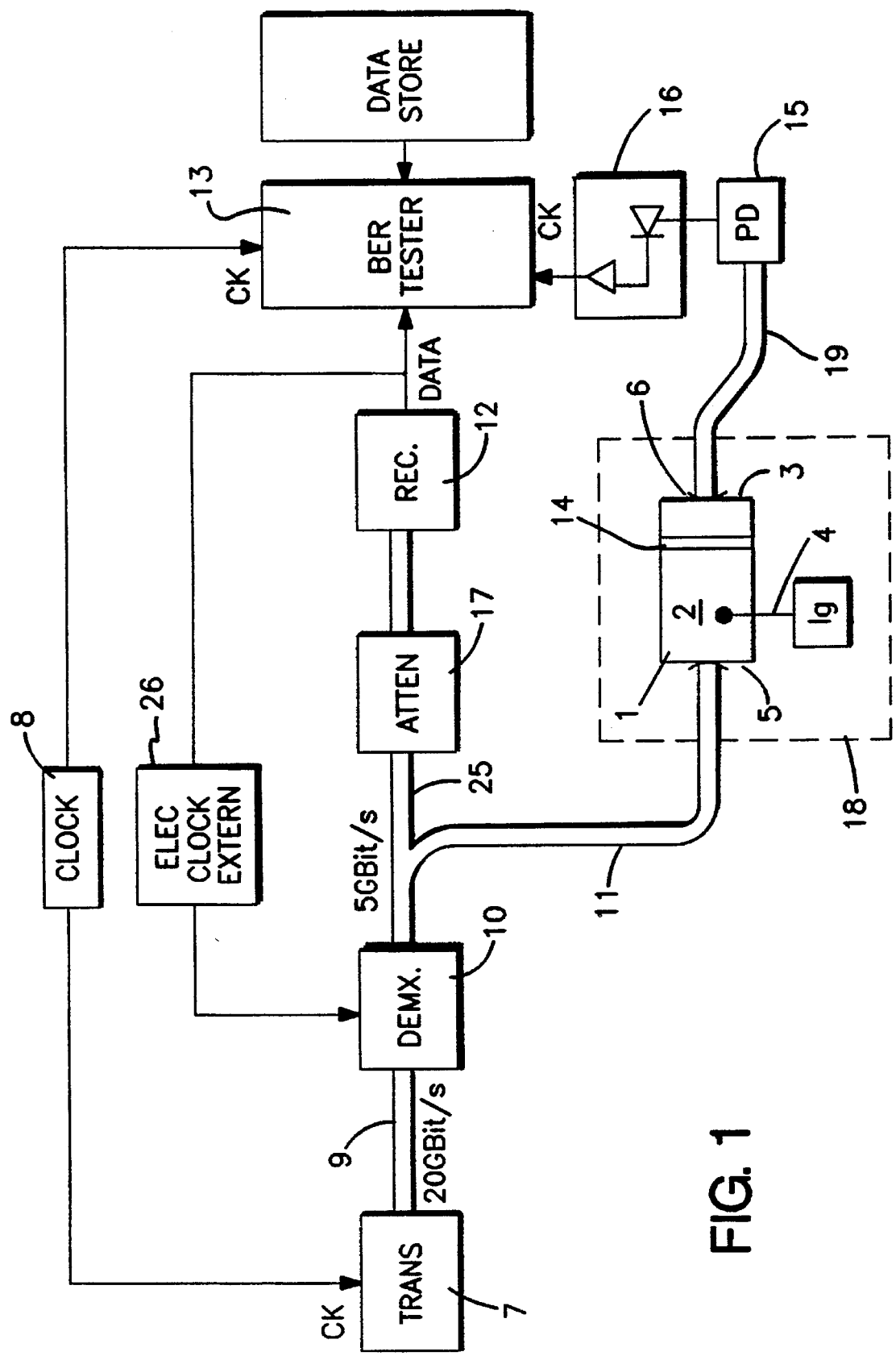
FIG. 1 shows a block diagram of the clock recovery system connected to error test equipment.

For ease of understanding, it should be noted that optical pathways are shown in FIG. 1 by double lines, while electrical pathways are shown by single lines.

Referring to the drawings, FIG. 1 shows the general layout of equipment using optical clock extraction, in which a data signal on a pathway 9 is divided between a 5 Gbit/s receiver for receiving and/or processing the data, and a clock extraction path 11 for extracting a clock signal for use by the receiver. The clock extraction path 11 terminates in a clock extraction system 18 which merely "sees" an incoming data signal on the path 11, and produces an optical clock output on an output pathway 19. The clock extraction system 18 includes a SP-LD 1 having a gain region 2 and an absorbing region 3. A current input 4, supplying gain current Ig, is provided to the gain region 2, and the SP-LD 1 generally has a Fabry-Perot structure with an optical input facet 5 at a first end adjoining the gain region 2, and an optical output facet 6 at the other end adjoining the absorbing region 3. The gain and absorbing regions 2, 3 are separated (most visibly at least) by a gap 14 in a metallic p- electrode layer on the SP-LD 1. The structure of the SP-LD 1 is described below in greater detail with reference to FIG. 16.

The gain region 2 is typically biased to greater than 70 mA in order to provide gain, and the SP-LD 1 is used non-inverted, that is with the (divided) p-contact uppermost, for convenience.

The SP-LD 1 operates to extract a 5 GHz clock signal from a digital optical input signal, coupled in by means of the path 11 which is constituted by a lens-ended fibre.

The input signal could carry various types of data, either RZ or NRZ, but needs to include a significant clock component of some sort for extraction by the SP-LD 1. In the present embodiment, the input signal comprises a 5 GBit/s optical RZ data signal. This input signal is generated by a transmitter unit 7 which is controlled by a separate clock 8 and produces OTDM RZ data at 20 GBit/s, on the pathway 9. This is demultiplexed, by a lithium niobate demultiplexer 10, to produce a 5 GBit/s data signal, part of which is then coupled into the path 11.

The transmitter unit 7 generates 20 ps long optical pulses, at 20 GBit/s, made up of four 5 GBit/s OTDM channels. The lithium niobate demultiplexer 10 employs lithium niobate modulators driven by 5 GHz electronic clock signal optically to select one of the 5 GBit/s channels. More details of the transmitter and demultiplexer can be found in a paper entitled "20 GBit/s, 205 Kilometer OTDM Transmission System" Electronics Letters Vol 27 number 11 pp 973–974 (1991) by G E Wickens et al.

A data portion of the demultiplexed optical data signal is transmitted to the receiver 12 where, in normal operation, the signal would be amplified and converted to an electrical form before being processed using the clock output of the SPLD 1. In the arrangement shown in FIG. 1, however, the output of the SP-LD 1 is instead supplied, via a photodetector 15 and an amplifier 16, to an error rate tester 13. The amplifier 16 has a bandwidth limit of 6 GHz in order to convert the 5 GHz clock output from the SP-LD 1 to a sine wave for use in the error rate tester 13.

The 5 GBit/s optical data signal is split between the clock extraction path 11 and the data path 25 using a 3 dB fibre coupler (not shown). The primary signal goes via an optical attenuator 17 to the 5 GBit/s receiver 12 which outputs the data signal in electrical form to the error rate tester 13. The electrical data signal is also used to generate a 5 GHz electrical clock signal to drive the demultiplexer 10 using an electronic clock extraction device 26.

The operation of the signal generating, receiving and testing components shown in FIG. 1 is generally of known type, and further details are not given herein where that is the case. However, the operation of the optical clock extraction system 18 is very important to embodiments of the present invention, and, in particular, operational characteristics of the SP-LD 1 are important. These are therefore described below in some detail.

The SP-LD 1 extracts a clock signal from a binary data signal by producing an output pulse train which can be thought of as a continuous train of consecutive RZ data "ones". The mechanism is that the SP-LD 1 self-pulsates at a frequency dictated by a clock component in the data signal input.

Figure 2:
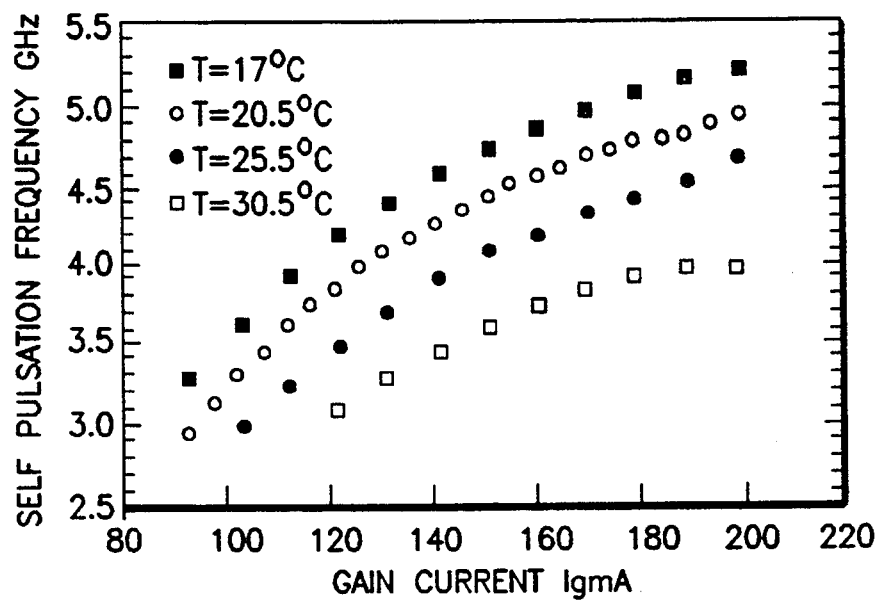
FIG. 2 shows a graph of a relationship between self-pulsation frequency, gain current and temperature in a SP-LD suitable for use in the system of FIG. 1.
Figure 3:
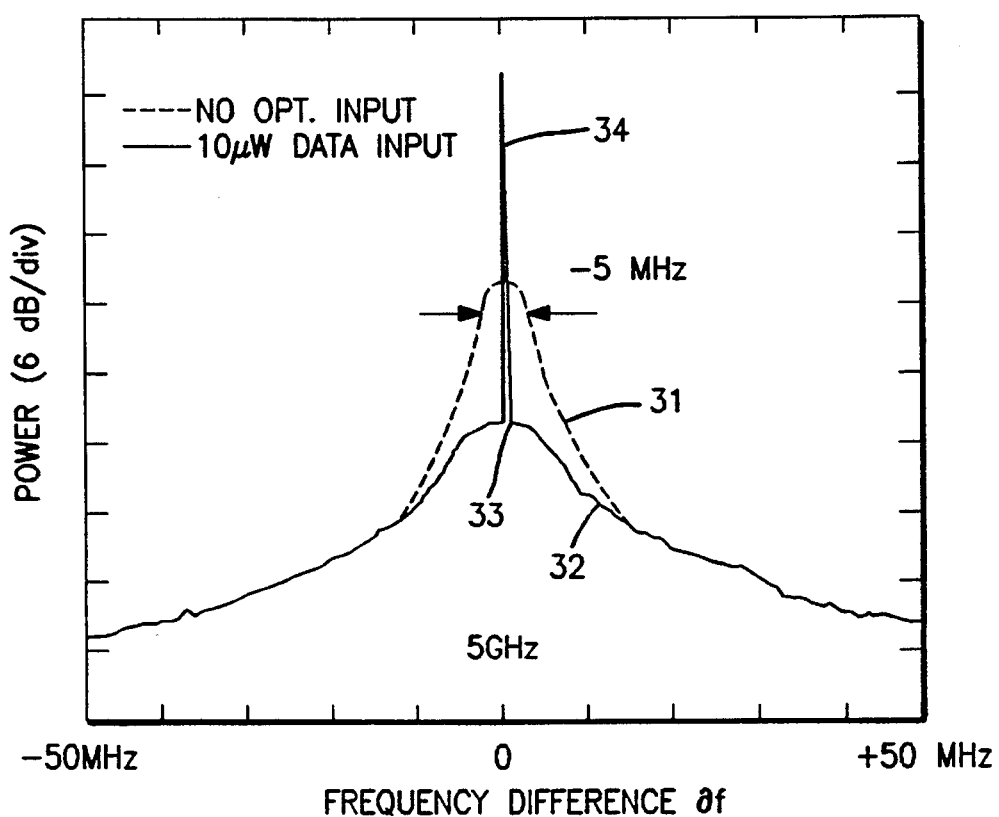
FIG. 3 shows the radio frequency spectrum measured after photodetection of the SP-LD output, with and without an optical input to the SP-LD.

Referring to FIGS. 2 and 3, the output pulse frequency of the SP-LD 1 is affected by the gain current Ig at the current input 4 to the gain region 2, by the device temperature, by absorber bias and by any optical input signal on the path 11. Referring to FIG. 2, in the absence of an optical signal, the self-pulsation frequency of the SP-LD 1 increases with increasing gain current Ig. It can be seen that, at 17° C., with the absorbing region 3 unbiased, the self-pulsation frequency of a single device can range from about 3.25 GHz to about 5.2 GHz over an increase in Ig from 90 mA to 200 mA.

FIG. 2 also shows that the self-pulsation frequency of the SP-LD 1 is significantly subject to device temperature. Hence, at a device temperature of 17° C., the self-pulsation frequency reaches 5 GHz at a gain current Ig of just over 170 mA. However, at a temperature of 30.5° C., the frequency at the same gain current Ig drops to about 3.8 GHz.

FIG. 3 shows very clearly the locking of the output pulsation frequency of the SP-LD 1 to an optical input signal with a 5 GHz clock component. A first curve 31 shows the SP-LD output with no optical input signal, while a second curve 32 shows the SP-LD output when locked to a 10 µW 5 GBit/s. optical input on the SP-LD input path 11. The SP-LD output shown in FIG. 3 is measured in both cases in terms of output power over a RF spectrum of 100 MHz, centred at 5 GHz.

It can clearly be seen that the first curve 31 for the unlocked output, although generally centred at 5 GHz, is very much wider in frequency spread over its central portion than the second curve 32, which shows a very strong, narrow clock component 34 at 5 GHz. In the locked condition, there is a contrast in power level of 30 dB between the SP-LD output clock frequency component and the background level, these meeting as shown in FIG. 3 at a distinct shoulder 33. In the unlocked condition, the output curve 31 shows a broad 5 GHz resonance which has a full width at half maximum (FWHM) of about 5 MHz.

Figure 4:
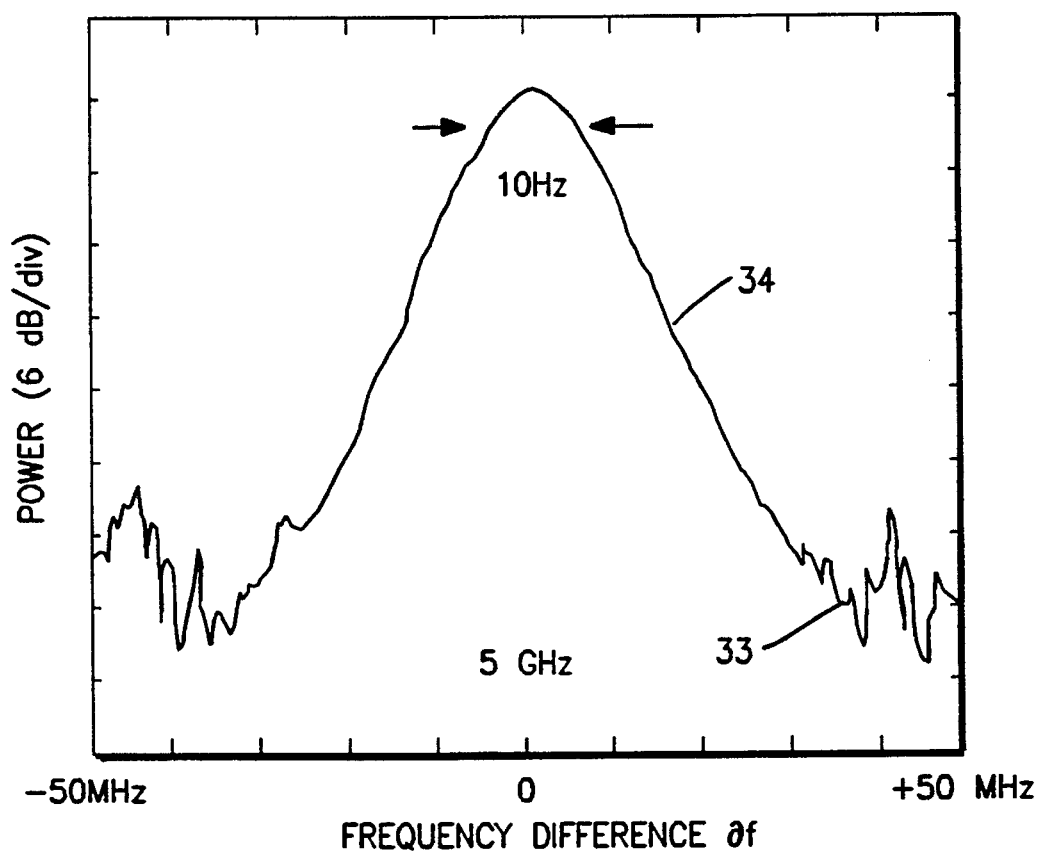
FIG. 4 shows the output linewidth of the SP-LD when locked to a 5 GBit/s optical input, measured at a significantly higher frequency resolution than the graph of FIG. 3.

FIG. 4 shows the frequency spread in the clock component 34 of the locked SP-LD output 32 using a better frequency resolution. This indicates that 3 dB RF electrical bandwidth of the 5 GHz clock component 34, as shown on FIG. 3, is only 10 Hz, but this is in fact the resolution limit of the analyser used in making these measurements. This indicates an effective oscillator Q, for the locked clock output, of better than $5 \times 10^8$.

The generated optical clock signal 34 has approximately the same spectral purity in the electrical domain as the transmitter unit 7. However, the presence of relative intensity noise, low frequency phase noise and stimulated-spontaneous emission noise increases the noise floor, and introduces a pedestal to the spectrum.

Referring again to FIG. 3, it will be noted that the quality of the unlocked clock output 31 of the SP-LD 1 corresponds to an effective oscillator Q of about 1000.

Figure 5:
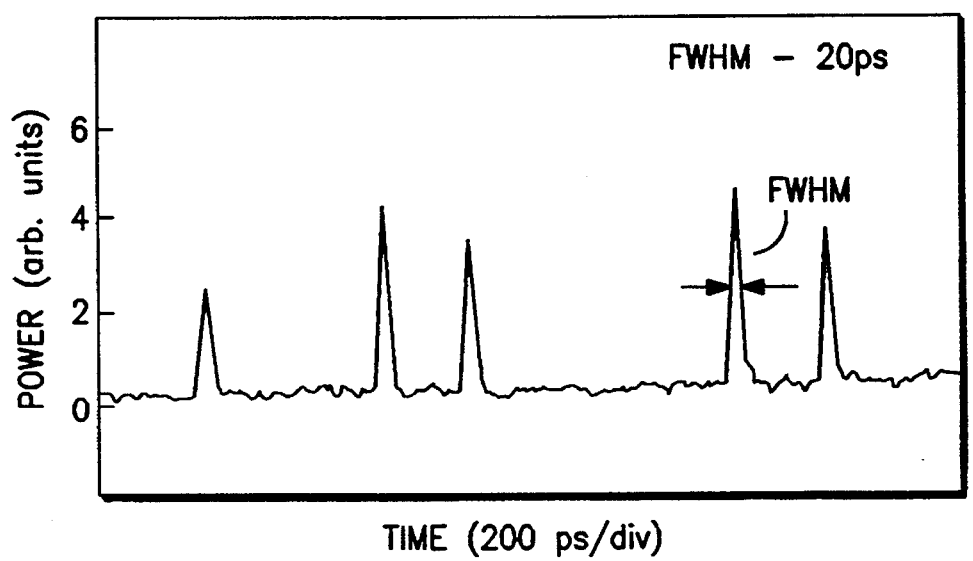
FIGS. 5 and 6 show samples of an input optical data train, and an output pulse train for a SP-LD, as measured with an optical oscilloscope.
Figure 6:
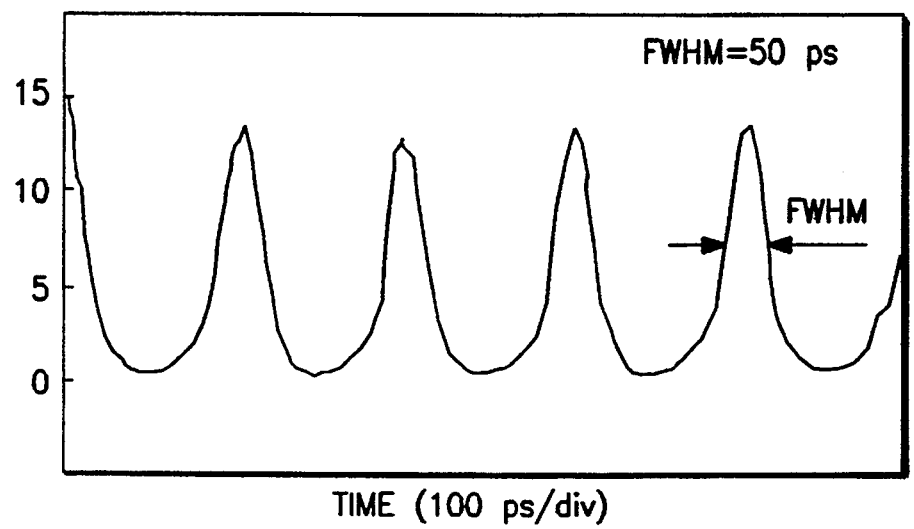

FIGS. 5 and 6 illustrate pulse width rather than pulse repetition frequency. Using an optical input signal on the SP-LD input path 11 with mean power about 10 µW, the input signal wavelength is adjusted to coincide with a Fabry-Perot mode of the SPLD at about 1.56 µm. The optical input signal is provided by an externally-modulated, mode-locked semiconductor laser diode, and comprises $2^7 - 1$ RZ data at 5 GBit/s injected into the gain region 2 of the SP-LD 1. The presence of the input optical data synchronises the self-pulsations of the SP-LD 1 to the data clock rate, and FIGS. 5 and 6 show samples of the input optical data train to the SP-LD and the output pulse train, respectively, as measured with an optical oscilloscope.

It is not essential that the input signal wavelength coincides with the Fabry-Perot mode but, if this is not the case, it is generally necessary to increase the power input. However, the signal does see gain as it passes through the SP-LD 1.

With the SP-LD 1 locked to the input data, the minimum measured pulse width, in terms of full width at half maximum (FWHM) as shown in FIG. 6, is about 50 ps, with an extinction ratio of about 15 dB, and a mean power of about 1 mW in the fibre of the output pathway 19. FIG. 5 shows that the separation between consecutive "ones" in the input signal is also 200 ps, but that the FWHM of each "one" is only about 20 ps.

FIGS. 5 and 6 clearly show the operation of the SP-LD 1 as a clock recovery device. The input signal shown in FIG. 5 quite clearly shows a data train containing both "ones" and "zeros", while the output signal shown in FIG. 6 quite clearly shows a regular series of output pulses spaced at the interval of the consecutive "ones" shown in FIG. 5.

Figure 7:
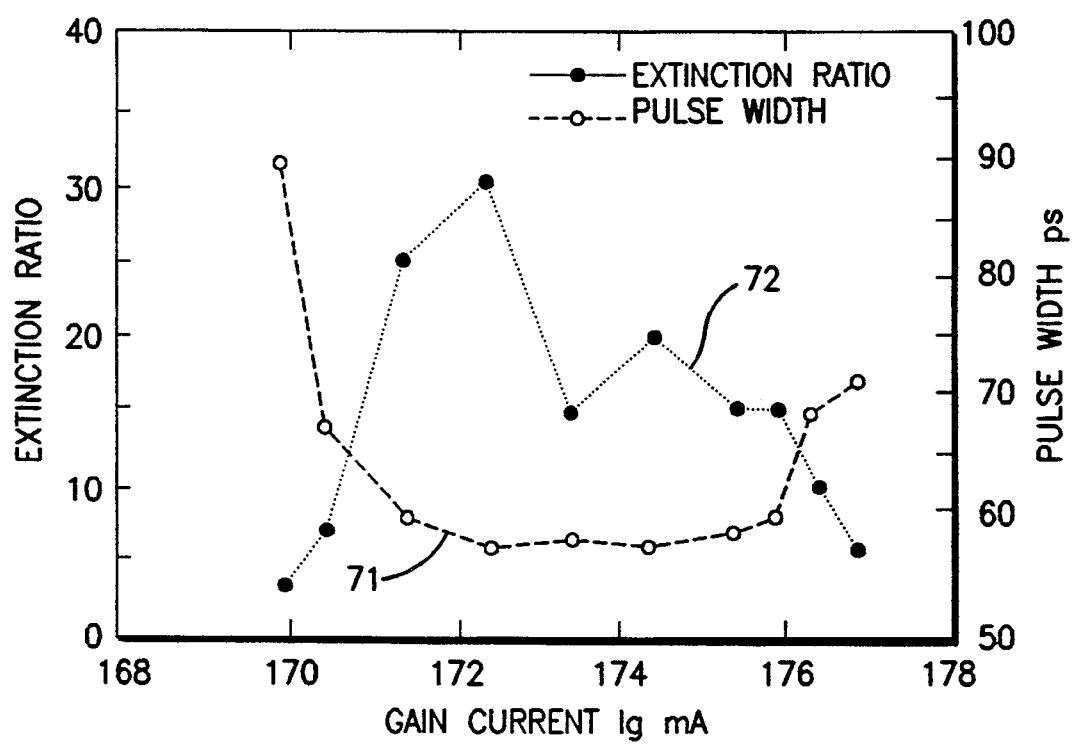
FIG. 7 shows the variation of pulse width and extinction ratio for the SP-LD as a function of gain current.

FIG. 7 shows the frequency range over which the SP-LD output pulses can be locked to the input clock rate. FIG. 2 shows that the self-pulsation frequency of the SP-LD 1 is of the order of 5 GHz when the device temperature is about 17° C. and the gain current Ig lies in the range of from 170 to 175 mA. FIG. 7 shows that altering the gain current Ig to the gain region 2 of the SP-LD 1 alters the natural self-pulsation frequency. Thus, for an optical input to the SP-LD 1 of a 5 GBit/s data signal of average power 10 µW (the temperature of the SP-LD 1 being maintained at 17° C.), the output pulse width 71 and extinction ratio 72 as a function of the gain current Ig can be seen to be usably narrow and usably large, respectively, and to stay roughly constant, only in a range of currents from about 171 mA to about 176 mA. Outside this range, it can not be said that the output pulses of the SP-LD 1 are synchronised to the clock rate of the input signal.

Figure 8:
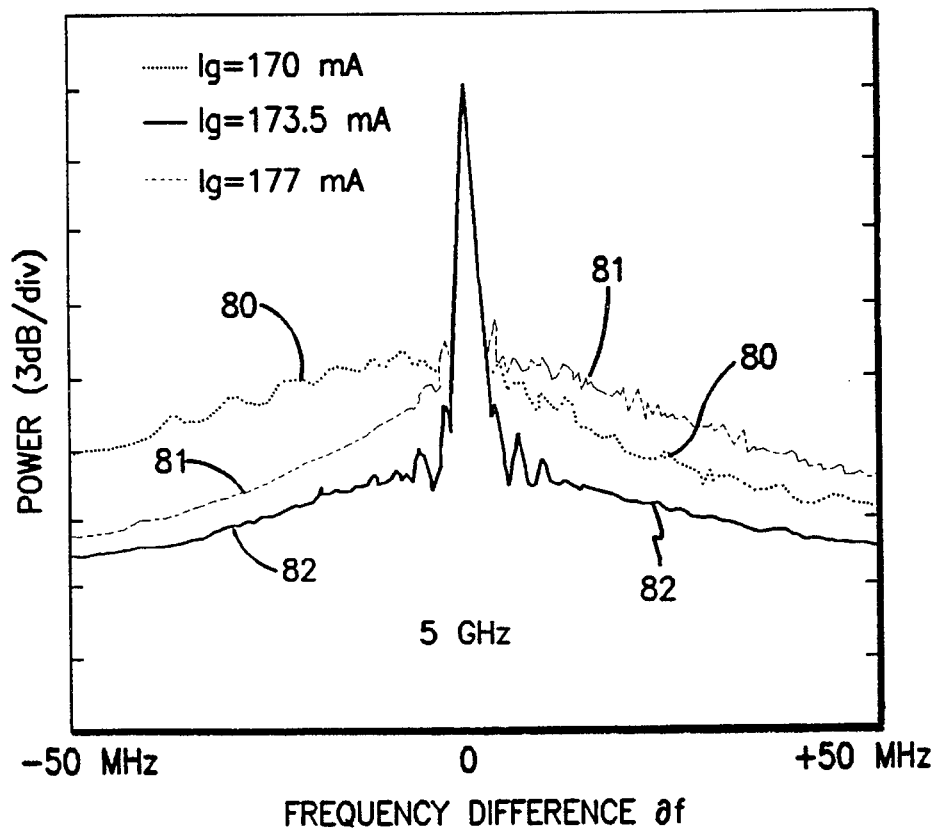
FIG. 8 shows the radio frequency (RF) spectrum of the SP-LD optical output for locked operation and just beyond the limits of locking.

Referring to FIG. 8, the time-averaged RF spectrum of the SP-LD output at three different values of Ig shows the drop in extinction ratio just beyond the limits for locking, that is just outside the range mentioned in respect of FIG. 7. FIG.

8 also shows the offset nature of the background RF spectrum at these high and low gain currents, as affected by the natural self-pulsation frequency of the SP-LD 1 beginning again to dominate, at a different frequency than the clock frequency, at the different gain currents Ig.

In particular, it can be seen that the drop in extinction ratio is due to a rise in the background RF spectra 80, 81 at both 170 mA and 177 mA with respect to the background RF spectrum 82 where the gain current Ig is 173.5 mA. It can also be seen that the background on each of the frequency spectra 80, 81 at 170 mA and 177 mA is offset towards the side of the 5 GHz clock position to which the particular gain current would encourage the SP-LD 1 to emit pulses in the absence of an optical input.

In FIG. 8, for the RF spectra 80, 81 at gain currents Ig of 170 mA and 177 mA, the SP-LD output is not sufficiently synchronised to the input to achieve acceptable locking to the input RZ clock data.

It should be noted that the measured locking range, in terms of frequency differential between the natural self-pulsation frequency of the SP-LD 1 and the input clock frequency, is about 50 MHz, or about 1% of the input clock frequency, when using an input signal of power 10 μW. Increasing the power of the input signal would increase the frequency range over which the output of the SP-LD 1 can be locked to the clock frequency.

Variations in the polarisation state of the optical input signal to the SP-LD 1 result in no loss of synchronisation at the SP-LD output, or change in output clock power. It seems, therefore, that the synchronisation mechanism is polarisation insensitive, at least at the input wavelength concerned. This latter parameter is selected to be about 1.56 μm, coincident with a Fabry-Perot mode of the SP-LD 1.

It could be expected that using an input wavelength that is coincident with a different Fabry-Perot mode would not affect this polarisation insensitivity.

Figure 9:
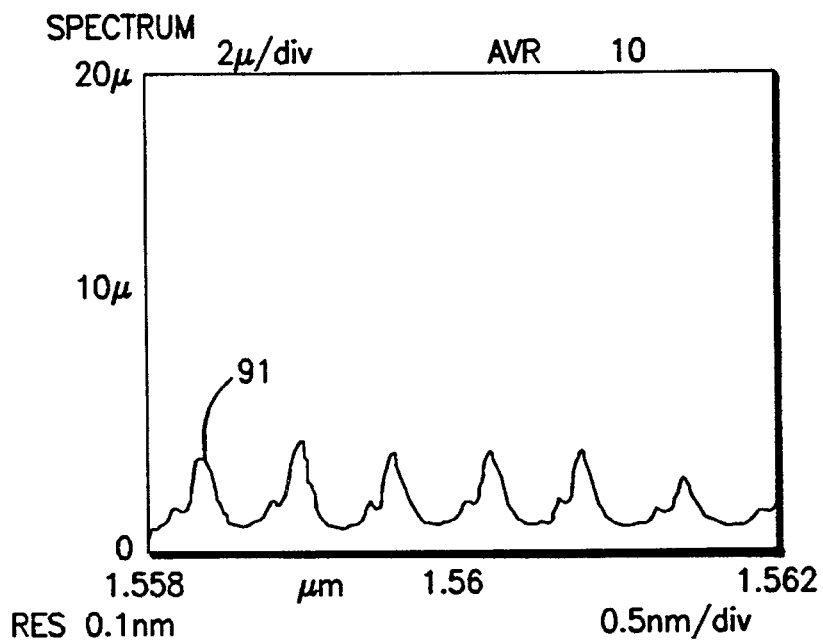
FIG. 9 shows the optical spectrum of the SP-LD output with no optical input signal.
Figure 10:
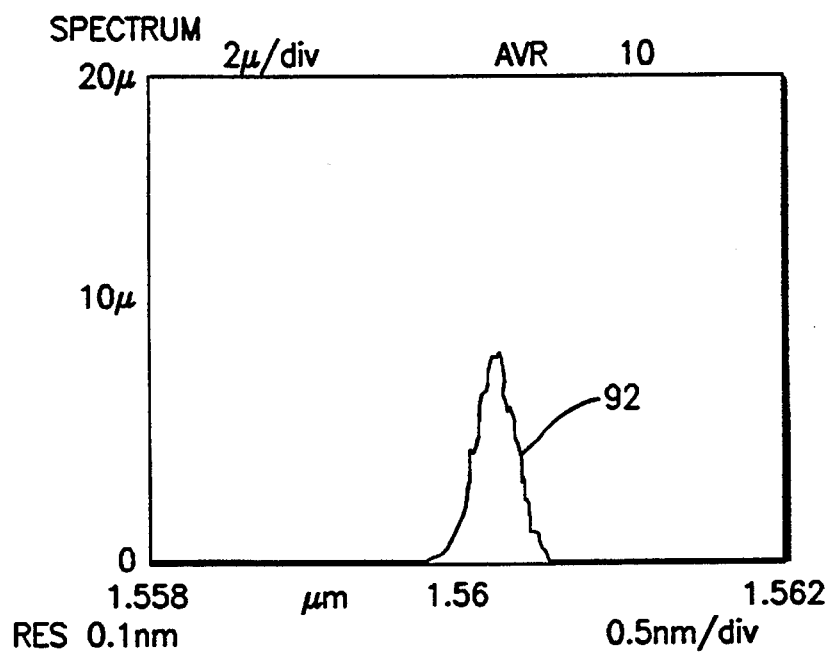
FIG. 10 shows, for reference, the wavelength spectrum of an input data stream.
Figure 11A:
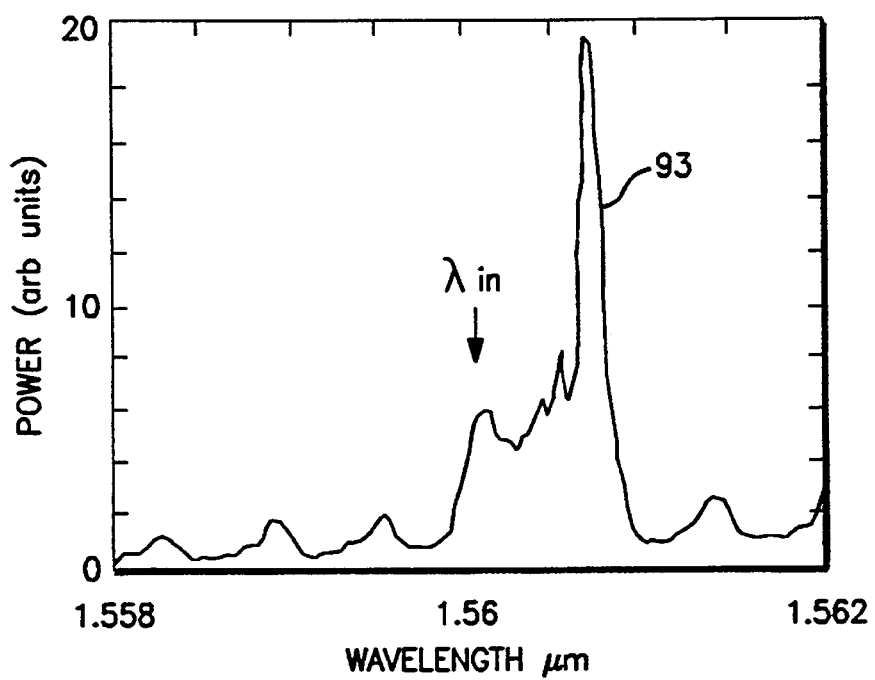
FIGS. 11a and 11b show the wavelength spectrum of the output of the SP-LD when locked to an input signal, at two different wavelength resolutions.
Figure 11B:
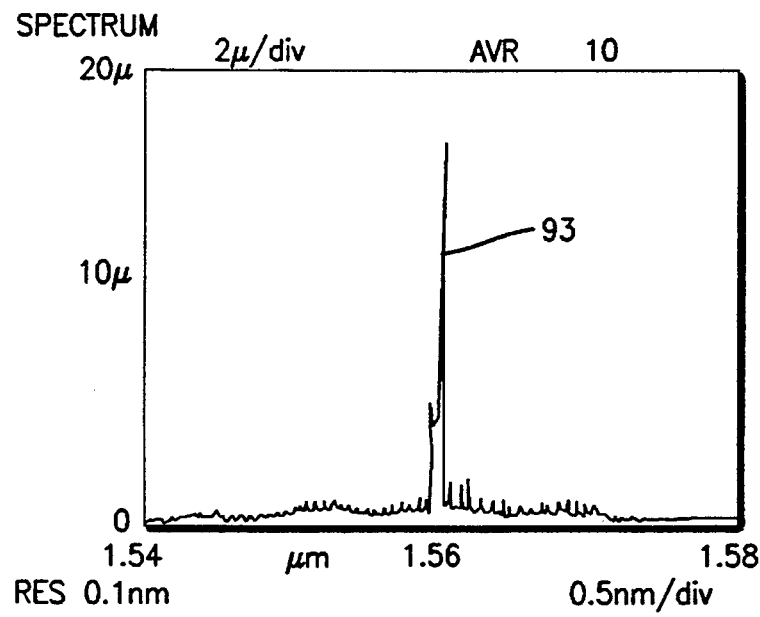

FIGS. 9, 10 and 11, show the optical spectra characteristics of the SP-LD 1, in terms of the wavelength distribution of the output pulses both when locked and not locked to an input signal. As shown in FIG. 9, the output of the SP-LD 1, when it is self-pulsating in the absence of any input signal, comprises a series of chirped Fabry-Perot modes 91 of substantially equal amplitude. FIG. 10 shows that the input pulses to the SP-LD 1 comprise single wavelength peaks 92, centred at a frequency coinciding with one of the Fabry-Perot modes of the SP-LD. FIG. 11 shows that the output of the SP-LD 1, when locked to an input signal comprising a train of pulses as shown in FIG. 10, quite clearly has a very dominant mode 93, interestingly not coincident with the central wavelength of the input pulses. The amplitude of other Fabry-Perot modes of the SP-LD 1 is approximately halved in the locked case, compared to FIG. 9, such that the mean power remained constant, sidemode suppression being ≧6 dB. (FIGS. 11a and 11b merely show the same phenomenon, that is the dominant mode in the SP-LD 1 locked output, at different wavelength resolutions.)

Using the arrangement of FIG. 1, as described above, tests can be carried out to assess the error rate of the all-optical clock recovery system. Thus, injecting 5 GBit/s optical RZ data with a mean power 10 μW into the SP-LD 1, results in an output pulse train consisting of approximately 50 ps optical pulses at a repetition frequency of 5 GHz. Different incoming data patterns can be tried to establish whether the clock extraction system remains synchronised to the data clock for long strings of "zeros". In particular, pseudo-random-bit-sequence (PRBS) data patterns comprising $2^7-1$ and $2^{31}-1$ sequences can be used respectively.

Figure 14:
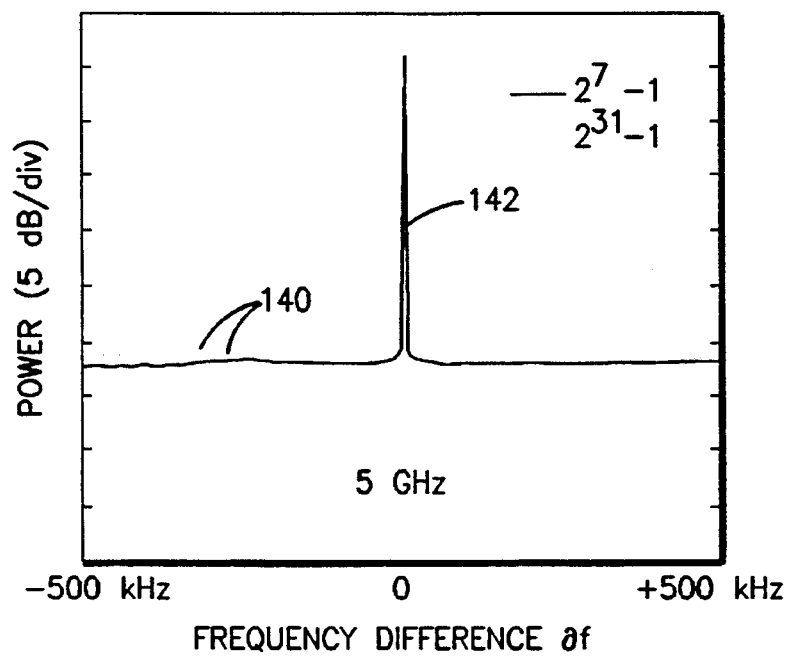
FIG. 14 shows the RF spectrum of the SP-LD output for data input signals comprising different numbers of consecutive "zeros"
Figure 15:
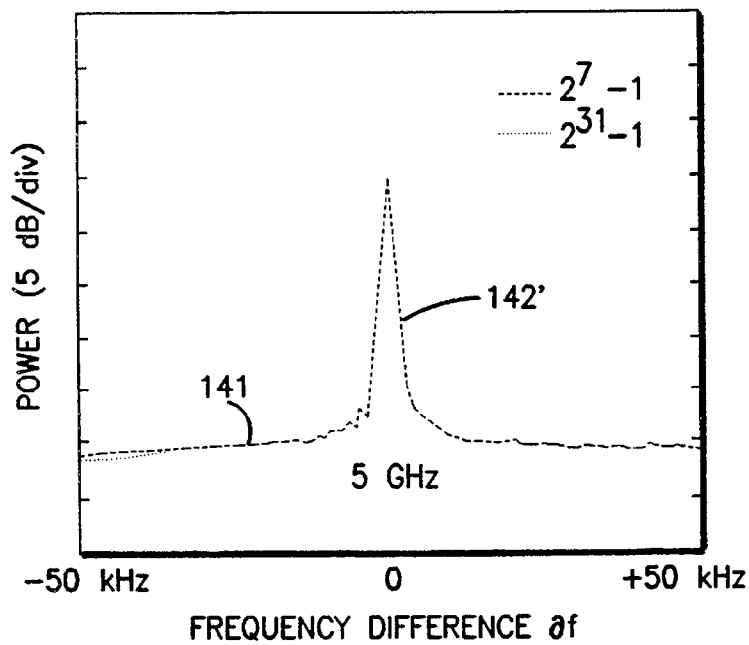
FIG. 15 shows the same RF spectra as FIG. 14 but centred on the fourth harmonic of the clock frequency shown in FIG. 14.

FIGS. 14 and 15 show the output pulse RF spectra of the SPLD output signal for each of the injected data patterns. (FIGS. 14 and 15 are effectively different parts of the same results curve, FIG. 14 being centred at 5 GHz in the frequency spectrum and FIG. 15 being centred at the fourth harmonic, 20 GHz. Each figure shows the results for both data patterns, superimposed.)

For both PRBS data patterns there is a strong clock component 142 (see FIG. 14) at 5 GHz, and harmonics thereof, one of these 142 (see FIG. 15) being at 20 GHz. Comparing the results for the two data patterns at each of the output pulse repetition frequencies, it can be seen that there is no significant change in either the noise floors 140, 141, relevant at both the 5 GHz peak and at the fourth harmonic 20 GHz, or the width of the 5 GHz clock output component 142. This suggests that the SP-LD 1 remains locked to an input clock over long lengths of consecutive input "zeros". (It might be noted that the low frequency cut-off of the RF amplifiers driving the LiNbO$_3$ data modulators in the transmitter unit 7 is 100 KHz. This would result in distortion of low frequency components of the optical input data signal at $2^{31}-1$.)

The results shown in FIGS. 14 and 15 are consistent with the quality of the locked clock signal at the SP-LD output shown in FIG. 4, which indicates an effective Q factor for the oscillator of more than $5 \times 10^8$.

Figure 12:
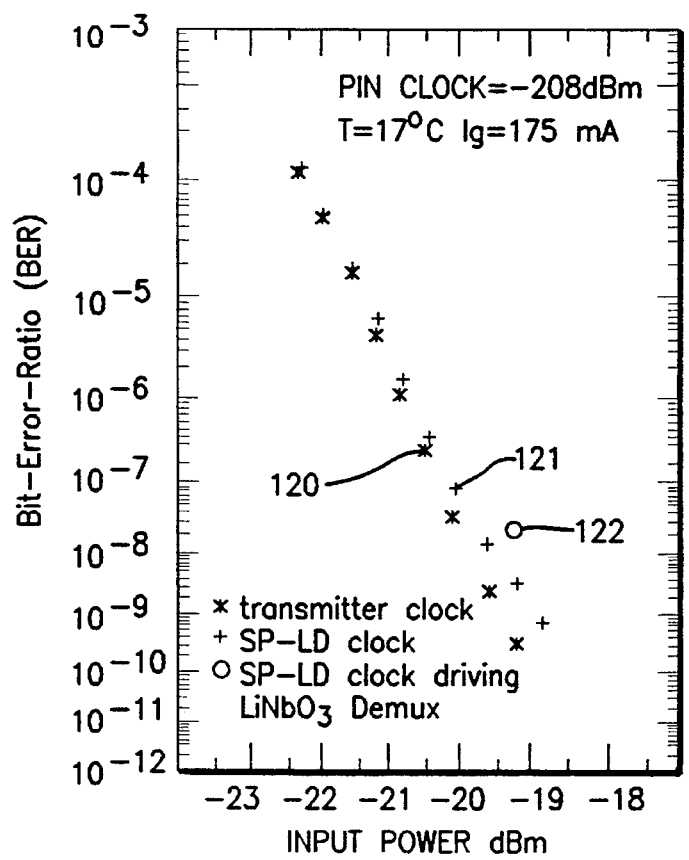
FIG. 12 shows a comparison of bit error curves for the SP-LD clock output compared with a transmitter clock.

In order to check the synchronisation of the optical clock signal output from the SP-LD 1, bit error ratio (BER) measurements can be performed on the $2^7-1$ data. The results are shown in FIG. 12. (Measurements on a $2^{31}-1$ sequence are not shown due to practical difficulties arising from the low frequency cut-off of the post detection electronics.)

The error rate tester 13 (see FIG. 1) is supplied, via the receiver 12, with data from the transmitter unit 7 which it checks against an identical, stored data pattern. FIG. 12 shows the input powers to the receiver 12 necessary to achieve a range of BERs. Thus, with the error rate tester 13 synchronised by the same clock 8 as the data transmitter unit 7, there is no observed error floor within the available input power to the optical receiver 12. That is, there could be seen to be a linear relationship between the input power and the bit error ratio (BER) achieved when plotted on the logarithmic axis shown.

When the BER tester 13 is synchronis ed with an electrical clock signal obtained by photodetection of the clock output of the SP-LD 1 however, an error floor is present at an estimated BER of about $10^{-12}$.

Selecting a desired BER of $10^{-9}$, it can be seen that there is approximately a 0.5 dB receiver sensitivity penalty due to use of the clock signal from the SP-LD 1. This means that, to achieve such a BER, the input power to the receiver 12 has to be increased by 0.5 dBm relative to the input power where the transmitter clock 8 synchronises the BER tester 13. This power penalty is likely to apply also where an all-optical system is involved, but is further discussed below in terms of possible sources and methods of reduction.

It should be noted that these BER curves are for a device temperature of 17° C., using a gain current Ig to the SP-LD 1 of 175 mA.

The reason for the error floor in the BER curve 121 for the SP-LD clock output is not completely understood but is thought likely to be due to mechanical and thermal instabilities in the mounting of the SP-LD 1. This is because the BER is found to be dependent on the input coupling. However, the gain current Ig to the SP-LD 1 could be varied by about 1 mA without a significant change in BER performance.

Any variation in BER performance is accompanied by a growth of the side bands in the RF spectrum of the SP-LD output which corresponds to other modulation components in the data spectrum. Increasing the input power to the SP-LD 1 would allow a greater operating tolerance for the gain current Ig, the device temperature and the optical input coupling.

It should be noted that error-free operation is possible for periods of up to about 3 seconds, and that the errors are bursty in nature. This suggests that the source of the errors is transient and occurs with a low repetition rate. There are two sources of low frequency perturbations in the system shown in FIG. 1 that are likely causes of these error bursts. Firstly, the transmitter unit 7 uses adjustable 300 meter long fibre delay lines to multiplex the OTDM data streams. Downstream of the demultiplexer 10, the relative path delays of the clock and data to the BER tester 13 is about 100 ns. This implies that the clock signal at the BER tester 13 originates from the data about 500 bits upstream. Thus, slow thermal effects on the delay lines at the transmitter unit 7 can cause drift in the relative synchronisation of signal and clock at the receiver 12.

The second likely cause of errors occurs at the SP-LD 1. It has already been noted that careful control of the optical input coupling to the SP-LD 1 is needed to ensure good suppression of RF components in the SP-LD output spectrum corresponding to data modulation components. The phase of light entering a Fabry-Perot device is important, and is affected by vibrational and thermal effects. Vibrations coupling into the "XYZ" positioners, and thermal convection effects, will perturb the SP-LD's operation and lead to errors. Improved packaging of the SP-LD 1 is expected to reduce these effects significantly, and result in better clock stability.

Figure 13:
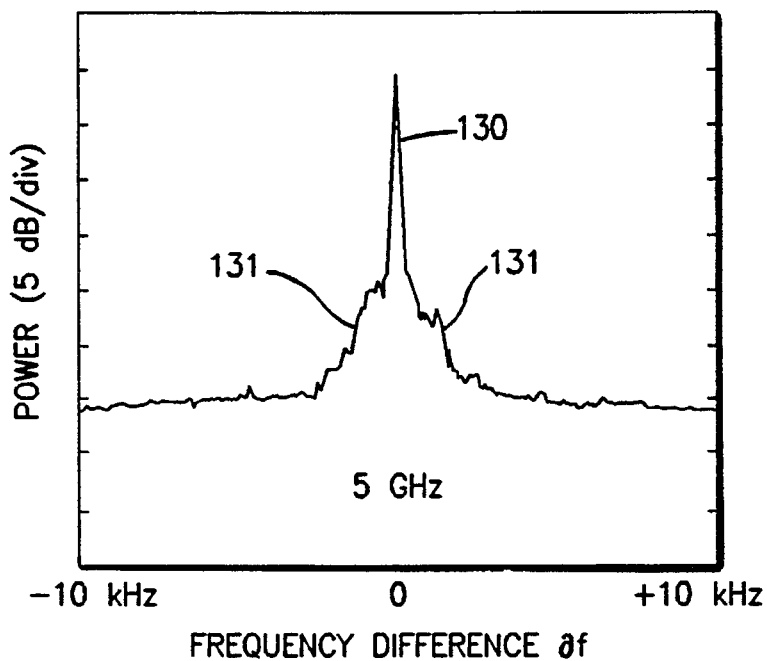
FIG. 13 shows phase noise in the RF spectrum of the SP-LD output over a 20 KHz frequency range.

FIG. 13 shows that the time-averaged SP-LD clock RF power spectrum has small shifts in frequency (less than 2 KHz) from the central peak 5 GHz clock output 130. This phase noise 131, thought to be due to thermal and vibrational effects, is probably the cause of the receiver sensitivity penalty. It produces only 25 dB suppression, where it would be preferred to have 40 dB suppression.

In a further BER experiment, an electrical clock derived from the SP-LD output is used to drive the demultiplexer 10. The BER tester 13 is synchronised from the transmitter unit clock 8. Because of long optical and electrical delays, of the order of 100 ns, between clock extraction and input to the demultiplexer 10, careful adjustment of the phase of the clock driver is needed. Thermal effects on fibre causes this phase to drift, resulting in periodic changes in BER performance. However a BER of $3\times10^{-8}$ can be achieved at $-19$ dBm receiver input, as shown by the circle 122 on FIG. 12.

A particular form of SP-LD 1 which might be used in the clock extraction system of FIG. 1 will now be described with reference to FIGS. 16a and 16b. The L-I characteristics of the device at a constant absorber bias show a non-linear threshold. The device has operating characteristics which are extremely advantageous in applications of the present kind. In particular, because of its design, it can self-pulsate at the kind of frequency ranges necessary for high data rate clock extraction, including of the order of 5 GHz.

In general, the SP-LD 1 is based on a standard buried heterostructure type of laser, the fabrication using metal organic vapour phase epitaxy (MOVPE) techniques generally of the type disclosed in the specification of our European patent application 87308402.4. However, the SP-LD 1 is differentiated from the device disclosed in that patent specification in that it is a "two-contact" device, and in that a selective zinc diffusion step is used during fabrication, the process being as follows:

The SP-LD 1 is based on a starting planar wafer, the structure of which, starting with the substrate, comprises:

a) a sulphur-doped, n-substrate 101, doped approximately $10^{19}$ cm$^{-3}$;

b) a sulphur-doped n-InP buffer layer 102, doped $3\times10^{18}$ cm$^{-3}$, 2 μm thick;

c) a quaternary active layer 103 of InGaAsP (equivalent wavelength 1.57 μm), undoped, 0.15 μm thick;

d) a zinc-doped, p-InP layer 104, doped $5\times10^{17}$ cm$^{-3}$, 0.15 μm thick;

e) a zinc-doped, p-quaternary layer 105 of InGaAsP (equivalent wavelength 1.1 μm), doped $5\times10^{17}$ cm$^{-3}$, 0.2 μm thick; and f) a zinc-doped, p-InP layer 106, doped $5\times10^{17}$ cm$^{-3}$, 0.05 μm thick.

Figure 16A:
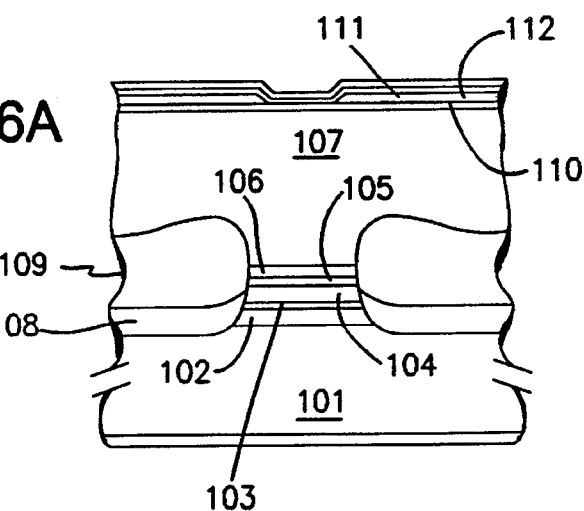
FIG. 16a and 16b show schematically the structure of a SP-LD for use in the clock recovery system of FIG. 1.
Figure 16B:
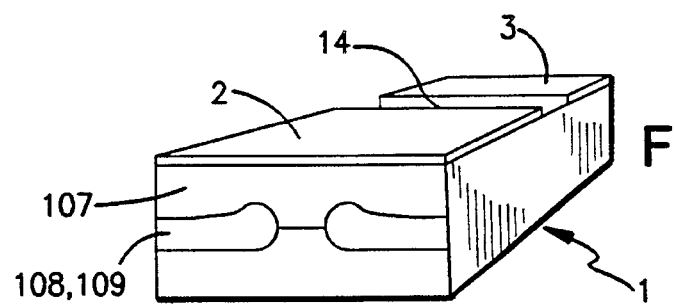

FIG. 16a shows a schematic cross-section of the finished SP-LD 1, the layers 101 to 106 being lattice matched and forming a mesa, and FIG. 16b shows a schematic perspective view of the finished SP-LD.

In fabrication, prior to etching of the mesa, a layer of silicon nitride 1000 Å thick is deposited and patterned using photolithography and etching. The sample is then selectively zinc diffused under conditions which ensure that the zinc dopant reaches the active layer 103 but not beyond. This avoids moving the p-n junction away from the active layer 103 and thus preserves the relatively high carrier density which should be present in the active layer in use of the device.

The selective zinc diffusion occurs only into the areas of the sample to become the absorbing region 3 of the finished SP-LD 1.

After the zinc diffusion step, fabrication follows a known procedure for producing buried heterostructure lasers, this being mesa etching followed by overgrowth of blocking layers 108, 109 with silica in place on the upper surface of the mesa, removal of the silica, and a second overgrowth of contact layers 107, 110 of InP and the ternary material InGaAs.

The ternary contact layer 110 is then patterned, using silica, to produce a stripe 10 μm wide extending above the mesa, and the sample is trenched. Electrically-insulating material 112, which may be silica, is deposited and patterned to lie either side of the ternary material stripes, this silica filling the trenching in the sample, whereafter contact metallisation 111 is deposited to make a stripe contact through the insulating layer 112 to the ternary contact material 110. The metallisation 111 and ternary contact layer 110 are chemically etched by known techniques to create a 10 μm wide gap 14 which is coincident with the interface between the zinc diffused and non-zinc diffused regions, that is, the absorbing region 3 and the gain region 2 in the finished device 1. This results in an isolation resistance between the two regions 2, 3 of the order of 300 or 350 Ohms. In practice, a plurality of SP-LD devices 1 would be made simultaneously on the sample.

This SP-LD structure comprises what might be known as a modified "two-contact laser". It is generally of a structure which is described and discussed in some detail in a paper presented in Boston in November 1990 by Barnsley et al and entitled "Clock Recovery System In All-Optical Signal Processing". Such devices pulsate at a speed which is generally a function of the length of the device and the recombination time of carriers in different regions of the device. Theoretical discussion of pulsation speeds in devices of the same general type is given in a paper by M Ueno and R Lang, published in the Journal of Applied Physics in 1985, referenced in the introduction to this specification.

The overall length of the SP-LD 1 is typically in the range of about 250 to 500 μm, with the length of the absorbing region 3 being typically 25 to 40 μm. Specific embodiments of suitable devices are as follows.

For self-pulsation at frequencies in the range of say 0.8 to 3.5 GHz, devices of overall length approximately 250 and 500 μm, but both having absorbing regions 3 of 40 μm, are suitable. For self-pulsation at frequencies in the range 3.2 to 5.2 GHz, a device of overall length approximately 500 μm, and absorbing region 25 μm, is suitable.

It should be noted that a device having an absorbing region 3 which is 60 μm long fails to self-pulsate. The mechanism of self-pulsation in a two-contact device of this type is that an optical output of the gain region 2, when lasing, bleaches the absorbing region 3 by filling it up with photons. The absorbing region 3 then stops absorbing, becoming transparent, which has the effect that the gain section 2 stops lasing. This has the effect that the absorbing region 3 returns to an unbleached condition, in which it reverts to its absorbing characteristics, and the gain section 2 is once more able to lase. The length of the absorbing region 3 affects its capability to operate in this way. If it is too short, it cannot absorb as required. If the absorbing region 3 is too long, the device fails to lase. This probably explains the failure of the device having an absorbing region 3 which is 60 μm long.

In arriving at a design for a device, it should be borne in mind that the gap 14 acts as an absorbing region. Therefore, the width of the gap 14 which is selected and the length of the absorbing region 3, cannot generally be decided independently of one another.

In an alternative fabrication technique, the zinc diffusion might take place at a later stage, that is to say after the overgrowth of the contact layer of indium phosphide 107 and the ternary layer 110. At this stage, silicon nitride can again be deposited and patterned using photolithography, and the sample zinc diffused.

After the zinc diffusion, the silicon nitride deposited for use during zinc diffusion is removed, the ternary contact layer 110 is etched to a stripe 10 μm wide lying above each mesa, the sample is trenched, an insulating layer 112 (such as silica) is deposited and patterned to create a stripe contact to the SP-LD with a metal contact layer 111, and a gap 14 in the metal and ternary contact layers 112 again etched at a position coincident with the interface between the zinc diffused and non-zinc diffused regions, the gain and absorbing regions 2, 3.

The SP-LD 1 as described above, made by either technique, can generally be described as a two-contact, uncoated buried heterostructure laser diode having a gap 14 in the p-side electrical contact between the gain and absorbing regions 2, 3. However, the gain and absorbing regions 2, 3 can be distinguished not only by the presence of the gap 14, but also by the selective zinc diffusion into the absorbing region 3 only. It should be noted that the isolation resistance between the two regions 2, 3, at about 350 Ohms, is less than that experienced for two-contact devices without the excess zinc.

The operation of the SP-LD 1 described above is described only in terms of 5 GBit/s RZ data. However, other input signals can be applied, such as high data rate input signals, or NRZ data input signals.

Figure 17:
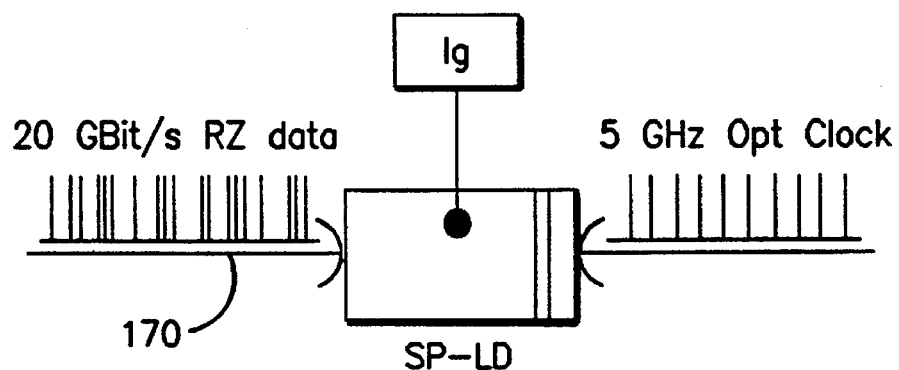
FIG. 17 shows diagrammatically a SP-LD extracting a 5 GHz clock signal from a 20 GBit/s OTDM input signal.

FIG. 17 shows a 20 GBit/s RZ data stream made up of four 5 GBit/s RZ data streams time multiplexed. This stream should not have any 5 GHz component in the modulation spectrum. However, this is only the case when the individual channels are separated in time by exactly one ¼ of 1 bit period of the 5 GBit/s channel, ie. 50 ps for a 200 ps (5 GBit/s) bit period and amplitude. If the channels are adjusted in time such that they are unequally separated, that is the channels are separated by 52, 48, 53, 47 ps respectively, or the amplitude of one channel is larger than the others, then a 5 GHz component will exist in the data spectrum. As long as this non-uniformity between channels does not affect the system and give a penalty at the receiver, then all-optical clock recovery using a SP-LD 1 is possible.

Figure 18:
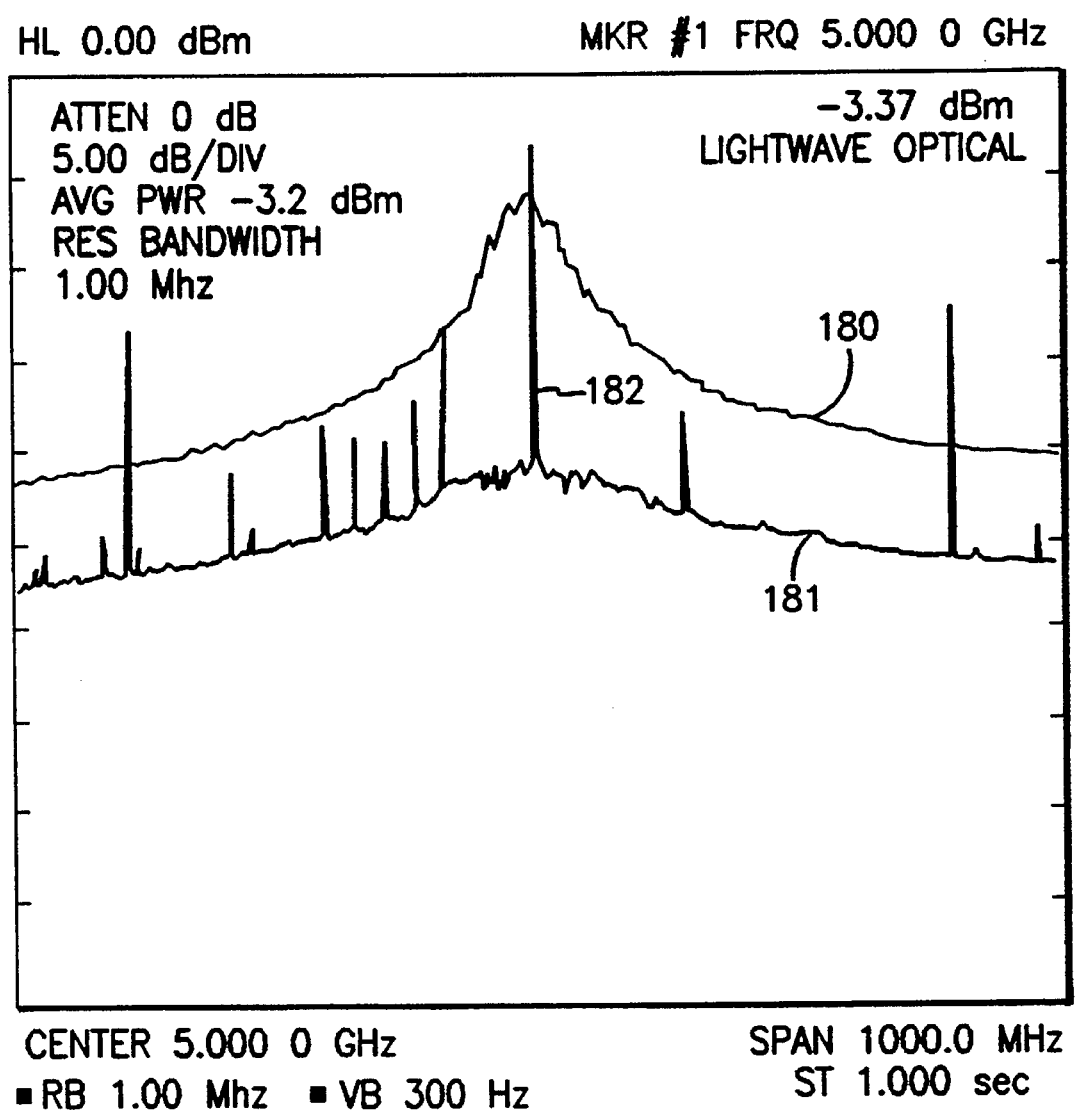
FIG. 18 shows the RF spectra of the SP-LD output without and with the 20 GBit/s OTDM input signal of FIG. 17.

Referring to FIG. 18, results (shown in RF format) of clock extraction using a SP-LD 1 on input data at 20 GBit/s show the synchronisation of the SP-LD output. As shown in FIG. 17, a 20 GBit/s data stream was injected into the SP-LD 1, adjusted for 5 GHz operation. The RF spectrum 180 without optical input showed no synchronisation, although a broad peak appeared about the 5 GHz frequency. With the injected data stream, the RF spectrum 181 clearly showed synchronisation. That is, a strong 5 GHz component 182 appeared. However, the RF spectrum of the SP-LD output also showed other frequency components.

It is not necessary that input data to the SP-LD 1 should be RZ, but it is important that it should have a clock component at the input to the SP-LD. Although NRZ data does not have a clock component, a distortion of the data can result in the generation of a clock component in the modulation spectrum. Thus, if the NRZ data is passed through a non-linear optical amplifier (NLOA), the data spectrum at the amplifier output contains a strong clock component, and injection of this NRZ data signal into the SP-LD 1 will synchronise the SP-LD output, and so allow clock extraction.

Figure 19:
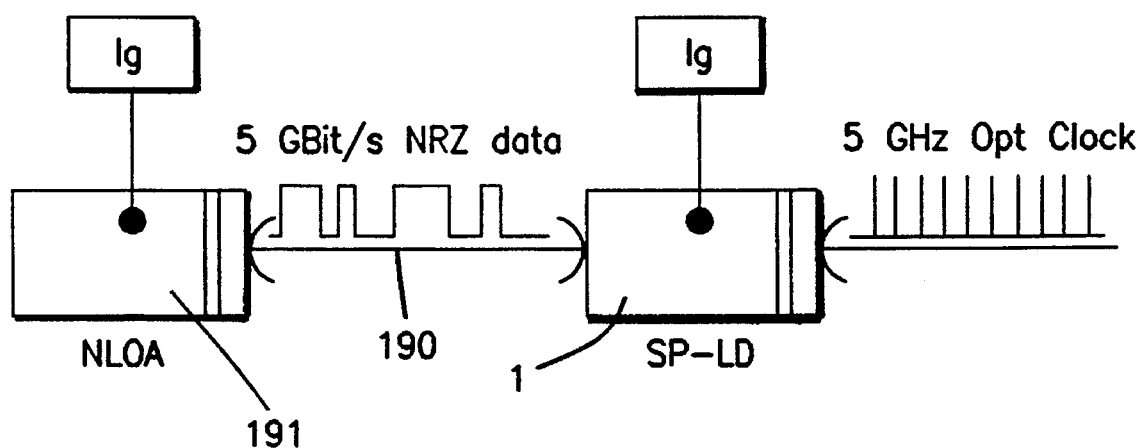
FIG. 19 shows an arrangement equivalent to FIG. 17 where non-return-to-zero (NKZ) data synchronises the SP-LD pulsations.

This latter effect is indicated in FIG. 19 at the pathway 190 between a NLOA 191 and the SP-LD 1. The effect of the NLOA is discussed in detail in the paper entitled "Clock Extraction Using Saturable Absorption in a Semiconductor Non-Linear Optical Amplifier"—Photonics Technology Letters 3, 9 pages 832–834 (1991).

The arrangement mentioned here in passing, in which a strong clock component can be generated in NRZ data, is described in detail in the specification our International patent application GB91/0203.

Figure 20:
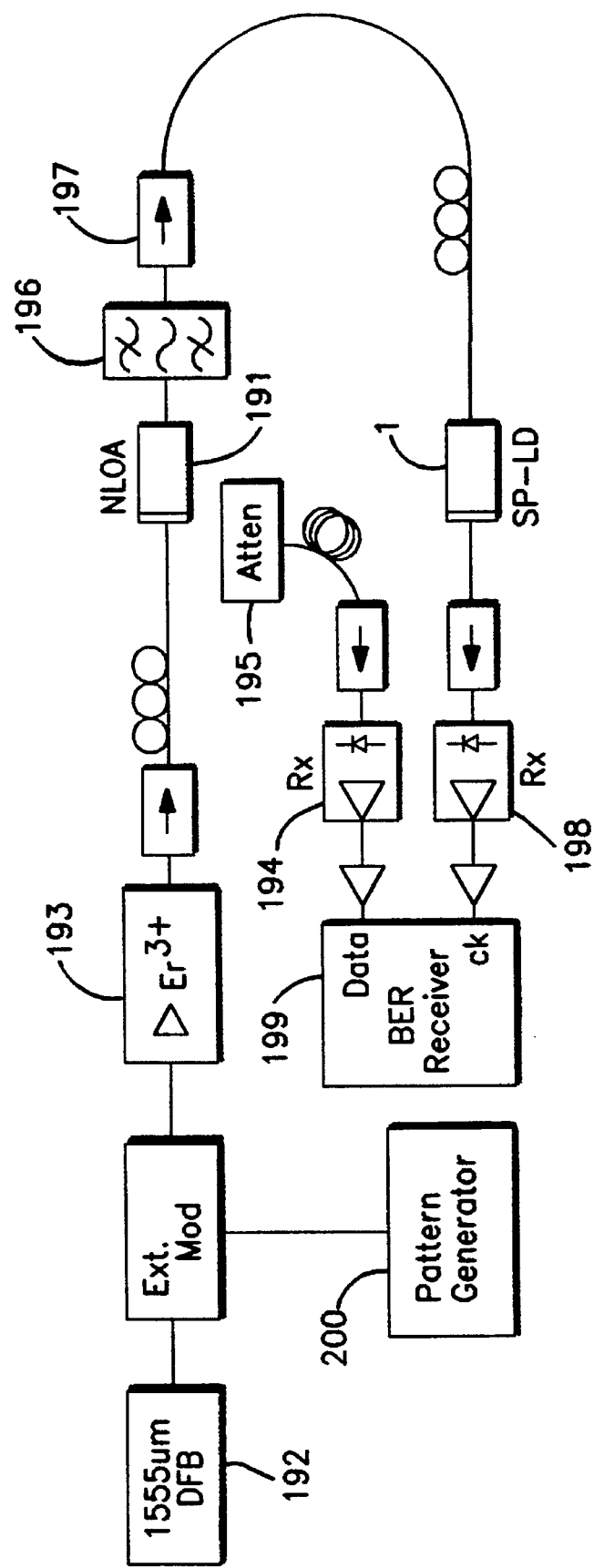
FIG. 20 is a schematic diagram of experimental equipment for generating a clock component in the modulation spectrum of NRZ data and then generating short optical clock pulses synchronised to the data.
Figure 21A:
FIGS. 21a to 21d show respectively, for the equipment of FIG. 20, NRZ optical input data, NLOA optical output, output from the SP-LD and an electrical clock signal input to a bit error ratio receiver.
Figure 21B:
Figure 21C:
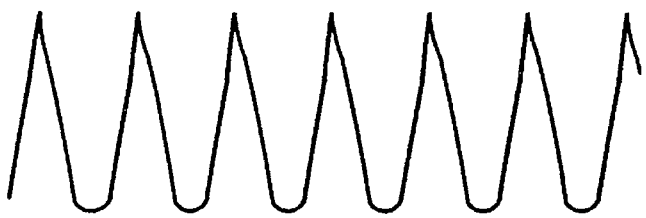
Figure 21D:
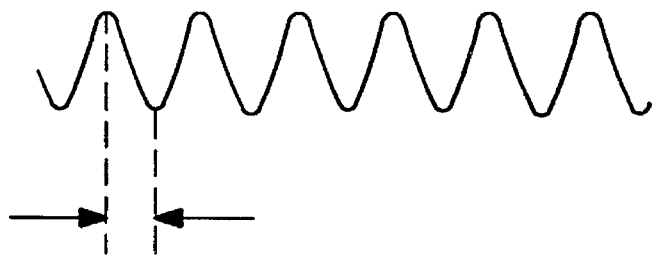
Figure 22A:
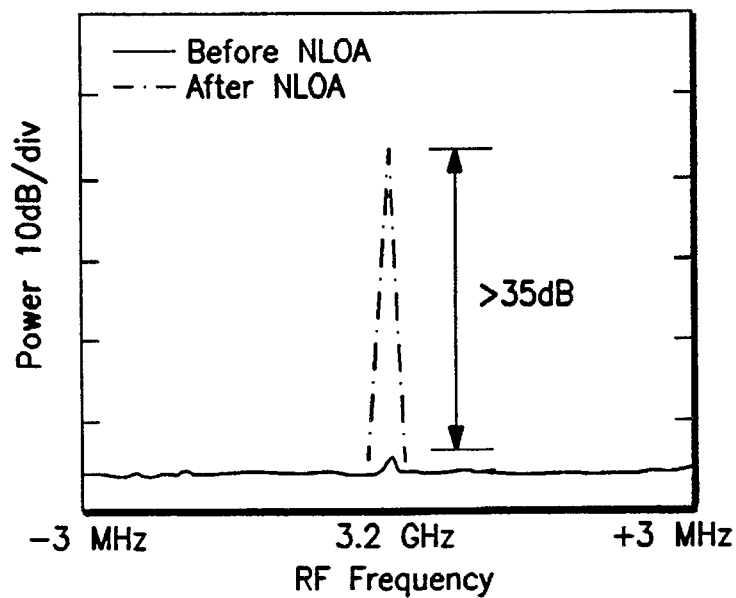
FIGS. 22a and 22b show respectively, for the equipment of FIG. 20, measurements on the RF modulation spectrum of the NLOA output comparing a clock component in that output to the input data spectrum, and the RF spectrum of the SP-LD output, showing an optically induced sweep of pulsation frequency.
Figure 22B:
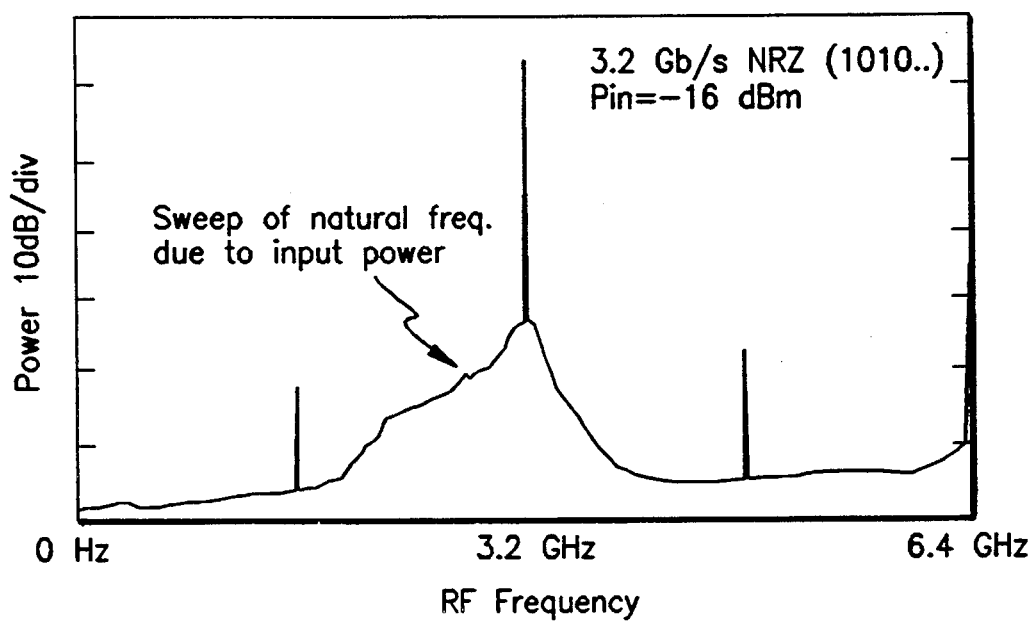

In order to assess an arrangement as shown in FIG. 19, experimental equipment as shown in FIG. 20 is used to generate the various performance results shown in FIGS. 21 to 24.

Referring to FIG. 19, NRZ data is passed through the NLOA 191, the output of which then contains a strong clock component. This output is injected into the SP-LD 1 whose output is synchronised, giving clock extraction. Optical clock recovery from a 3.2 Gbit/s NRZ signal is possible using the NLOA 191. The experimental arrangement and results achieved will now be described with reference to FIGS. 21 to 24.

Recently a number of methods of extracting a clock signal direct from optical data have been proposed. In these methods, the functionality is only possible due to the presence of a strong clock component in the modulation spectrum, that is to say for return-to-zero (RZ) formatted data. However in present systems non-return-to-zero (NRZ) formatted data is preferred, due to the lower system bandwidth required. True NRZ contains no clock component in its modulation spectrum, which presents a problem for the optical extraction techniques previously devised. In the following description the generation of a 3.2 GHz optical clock from a 3.2 Gbit/s NRZ 1010.. sequence is demonstrated.

The technique utilises two-contact non-linear semiconductor devices, firstly to generate a clock component to the modulation spectrum, and then to generate short optical clock pulses synchronised to the incoming data. The semiconductor devices are standard buried heterostructure laser diodes with a lasing wavelength around 1.55 µm. The experimental set up is shown in FIG. 20. The optical data (see FIG. 21a) is obtained by external modulation of a 1.555 µm DFB laser 192 with a 1010.. 3.2 Gbit/s NRZ data signal. This signal is amplified by an erbium amplifier 193 before being split using a 3 dB coupler. One data signal is incident on to a 10 Gbit/s optical receiver 194 via a variable attenuator 195 so as to perform bit-error-ratio (BER) measurements (as is described below). The other data signal is injected into the NLOA 191 (a temperature-controlled semiconductor MQW NLOA). The NLOA 191 has two sections with independent electrical contacts. The shorter section (~35 µm long) is biased to give a saturable absorbtion region (I~0.5 mA). The other, 435 µm long, section is a gain region biased at about 95% of the lasing threshold. The input power in the fibre upstream of the NLOA 191 of −11.5 dBm is sufficient to saturate the absorption region within the NLOA, which results in a strong relaxation transient on the rising edge (see FIG. 21b). This alteration of the pulse shape gives the data modulation spectrum a strong clock component. Measurements on the RF modulation spectrum of the photodetected NLOA output indicate that the clock component downstream of the NLOA 191 is >35 dB stronger than that of the input data spectrum (see FIG. 22a). The NLOA 191 operates at bit-rates from <10 Mbit/s to ~7.5 Gbit/s, thus demonstrating the broadband nature of this clock generation technique. The net fibre-fibre gain across the NLOA 191 is 2 dB. A 3 nm optical band pass filter 196 reduces the spontaneous emission coupled from the NLOA 191 into the SP-LD 1, and an optical isolator 197 prevents feedback between the two devices.

Figure 23:
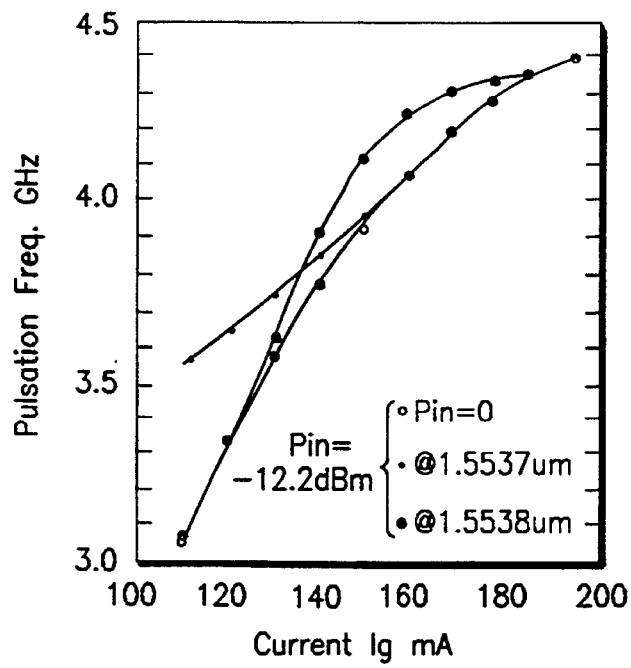
FIG. 23 shows, for the equipment of FIG. 20, the variation of self-pulsation frequency with bias current of an SP-LD without optical input, and with −12.2 dBm of input optical power at different wavelengths.

The SP-LD 1 is a bulk, buried heterostructure device with two independent sections. However, in this device 1, the short absorbing section is uncontacted, and has a high level of zinc in the absorbing region. The zinc shortens the carrier lifetime within the region, and this results in self-pulsation at GHz frequencies. The pulsation frequency can be varied by changing the DC bias current to the gain region, as shown in FIG. 23, or by altering the device temperature. The temperature-controlled SP-LD 1 is biased at a current of 110.2 mA, which gives a natural self-pulsation frequency of 3.075 GHz. The input power to the SP-LD 1 is −12.2 dBm, and the input polarisation is adjusted to TE, whilst the wavelength is aligned to one of the Fabry-Perot (FP) modes of the SP-LD.

In this configuration, the input optical signal shifts the peak relaxation frequency towards 3.2 GHz (see FIG. 22b and FIG. 23), and the output pulses from the SP-LD 1 become locked in frequency and phase to the input data clock frequency. Owing to the dependence of pulsation frequency on bias current (see FIG. 23), locking is dependent on the SP-LD bias which is controlled to ±0.2 mA. It is also dependent on the input power and signal wavelength. However, any small changes in these parameters could be accommodated by altering the DC bias to the SP-LD 1. The resultant optical clock signal consists of <85 ps pulses (see FIG. 21c), which are detected with a 3 GHz bandwidth receiver 198 to produce a sinewave clock signal (see FIG. 21d) suitable for synchronising the BER receiver 199. The RF spectrum of this clock signal shows a 45 dB power difference between the clock power and the background noise floor, which is similar to results obtained with RZ data.

Figure 24:
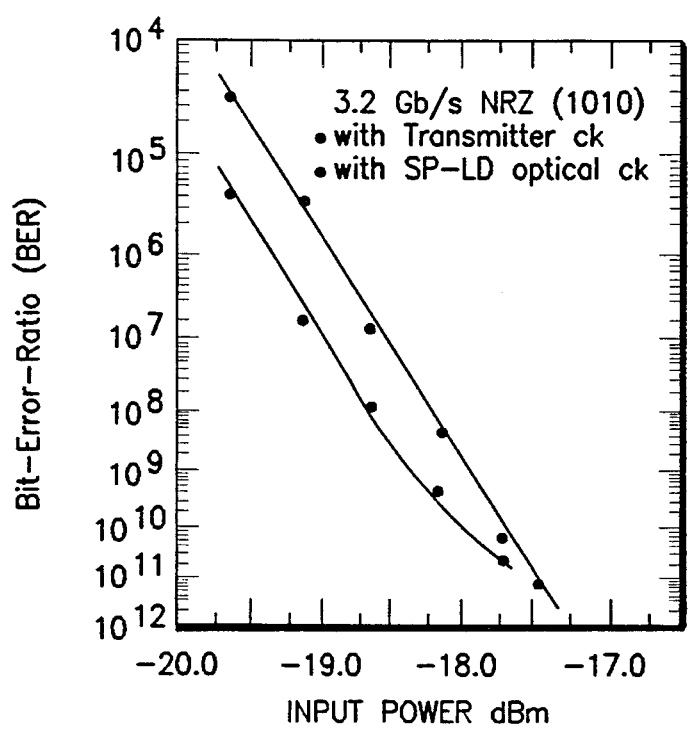
FIG. 24 shows, for the equipment of FIG. 20, bit error ratio measurements with changes in input power to an optical receiver, using synchronisation either from a pattern generator clock signal or from an extracted optical clock from the received data.

BER measurements are made on the received data by varying the power incident on the optical receiver 194. Synchronisation is achieved using either a "sneak" clock signal from a pattern generator 200 or from the extracted optical clock, and the results are shown in FIG. 24 which shows both sets of results. When the BER receiver 199 is synchronised from the pattern generator clock, the observed variation in BER (shown by the line 201 in FIG. 24) gives a receiver sensitivity for a BER of $10^{-9}$ of −17.8 dBm. When the BER receiver 199 is synchronised from the extracted clock (shown by the line 202 in FIG. 24), a 0.2 dB improvement in receiver sensitivity is observed. The reason for this observed sensitivity improvement is unclear at present, but it is believed to be due to the specific experimental set up employed. When the BER receiver 199 is synchronised using the transmitter clock, the data lags behind the clock by ~200 ns (~640 bits). However, when using the extracted clock, this relative path delay is only a few ns. Thus, any jitter associated with the data is mirrored in the extracted clock signal, and not in the transmitter clock. What is also evident from FIG. 24, is that there is evidence of a potential error floor at higher signal input powers to the optical receiver. The cause of this is again not clearly understood, but it is believed to be primarily due to thermal effects in the NLOA 191 and the SP-LD 1, causing phase errors which could be removed using a stabilisation feedback circuit.

Another very important point to consider is whether the technique can be used for true NRZ data. In order to investigate this, a $2^7-1$ pseudo random optical data sequence is generated by the pattern generator 200. The bias to the SP-LD 1 and to the NLOA 191 remain the same, and again there is a >30 dB increase in clock component power to the NRZ modulation spectrum downstream of the NLOA. However, the extracted optical clock signal now shows evidence of ~40 ps of jitter, and the tolerance to SP-LD bias is more critical. In the RF spectrum of the detected clock signal, there is less contrast between the clock power and the noise floor, with the modulation components either side of the clock frequency in the modulation spectrum only being suppressed by ~20 dB. It is believed that the reason for this poor rejection of unwanted frequency components is due to the format of the input signal to the SP-LD 1. In RZ data and optical-time-division-multiplexed data the optical "ones" are of similar time duration to the pulses naturally emitted from the SP-LD 1. In NRZ format this is not the case, and so a long series of "ones" in the input signal can shift the pulsation frequency around due to the change in the carrier lifetimes associated with the high rate of stimulated emission. This effect will, therefore, be quite fast with the resonance frequency responding within a few picoseconds.

This effect is clearly seen in FIG. 23, which shows the natural self-pulsation frequency of the SP-LD 1 when a CW −12.2 dBm signal is injected into the device at various different wavelengths. The wavelength dependence of the pulsation frequency is due to the dependence of the FP mode wavelength on bias current. This sweeping of the natural SP-LD pulsation frequency, due to the input signal power, allows other modulation components in the data spectrum to resonate with the SP-LD 1. This results in the poor contrast in power between the clock component and the other modulation components, which in turn produces the observed jitter in the output clock pulses. This hypothesis is partly validated by the observation that a larger relaxation transient to the NLOA output pulses (see FIG. 21b) results in a better synchronisation of the SP-LD output. An equal amount of jitter is observed for a $2^{23}-1$ pattern.

Since the NLOA 191 generates the clock component to the modulation spectrum, it is believed that it is the optical power dependence of the SP-LD pulsation frequency that prevents satisfactory operation with NRZ pseudo-random data. Further locking of the SP-LD output is required. Satisfactory operation could be obtained if the SP-LD output was further filtered to ensure that the clock component dominates. This could be done using electrical techniques such as a phase-locked-loop, but this would remove the bit-rate insensitivity. An alternative, but more complicated, way may be to cascade two SP-LD devices whose natural pulsation frequencies are locked together. The first SP-LD coarsely filters the clock component from the NLOA output modulation spectrum, and the second discriminates the clock frequency from adjacent modulating components. In order for this configuration to work, the jitter transfer and tolerance of the SP-LD will need to be good. The complications of such a clock extraction configuration may be eased by integration of the two-contact devices with passive waveguide technology.

It will be apparent, however, that this arrangement demonstrates all-optical clock recovery from a 3.2 Gbit/s NRZ 1010.. data sequence using the NLOA 191 to generate the missing clock component, which then locks the output of the SP-LD 1. The resulting clock signal is extremely pure and stable, and can be used to perform BER measurements.

Figure 25:
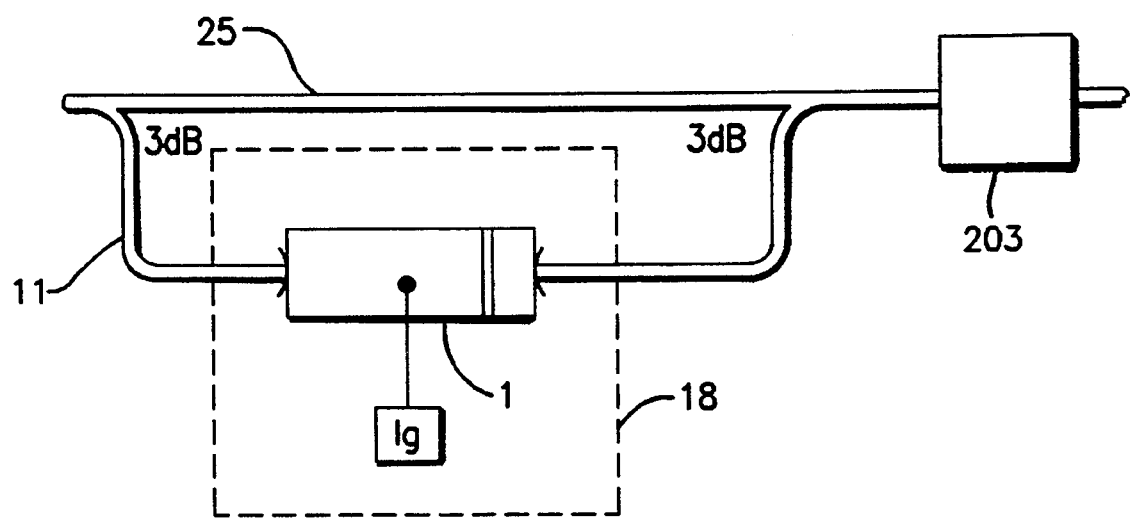
FIG. 25 shows the clock recovery system of the invention as it could be used in all-optical signal processing.

FIG. 25 shows the use of a clock recovery system according to the present invention in all-optical signal processing. An arrangement for exploitation of a clock recovery system in this manner may comprise the clock extraction system 18 of FIG. 1, coupled to receive part of an incoming data signal on an input pathway 11, again as in FIG. 1, but having its output coupled back into the primary data signal pathway 25. The combined clock output of the SP-LD 1 and data signal are then input to a threshold device 203 which detects coincidence of a "one" in the data signal and a clock pulse from the SP-LD 1.

A device which would be suitable as a threshold device 203 is a NLOA as described in the paper entitled "Absorptive Non-Linear Semiconductor Amplifiers for Fast Optical Switching" given by Barnsley et al at the SPIE symposium on optically activated switching, Boston, USA, on 5th Nov. 1990, this paper also having been incorporated into the specification of our International patent application GB91/02030.

It will be apparent that an SP-LD can be used to generate a synchronised optical clock from optical RZ data at a data rate of 5 GBit/s. The optical clock signal produced is stable and PRBS patterns of $2^7-1$ and $2^{31}-1$ result in virtually identical signals. BER measurements using the extracted clock signal show an excess receiver sensitivity penalty of 0.5 dB when compared to measurements using the system transmitter clock 8. However, there is evidence of a noise floor in the measurements, and the BER is dependent on the optical input coupling to the SP-LD 1 and on the gain current Ig. It is believed that this error floor is the result of slow thermal and vibrational effects. Good packaging of the SP-LD 1 should help to remove the effects.

Since the frequency of self-pulsation from the type of laser diode described above can be tuned by simply altering the DC current to the gain region 2, easy and rapid alteration of the resonance frequency of the clock recovery circuit is possible. This is ideal for networks operating with many bit-rates. Other doped two-section laser diodes have been found to self-pulsate with frequencies from 0.8 GHz to 3.5 GHz, so that, in principal, such laser diodes can operate as clock recovery units over the complete frequency range from 0.8 GHz to at least 5.2 GHz. Optimisation of the laser structure and, for instance, doping levels within the absorbing region 3 should result in even higher frequency operation in the future.

Optical clock recovery units constructed in accordance with the invention could also be very useful in OTDM systems for synchronising integrated optic and fibre demultiplexing techniques.

An important implication of the present invention is that, because optical threshold switches operating at up to 5 GBit/s are available and could be combined with an optical clock recovery system of the type of the present invention, the prospect of all-optical regeneration at frequencies of the order of 5 GBit/s has become more of a reality.

Embodiments of the present invention clearly may help overcome chromatic dispersion problems in long haul fibre transmission systems, and find major application in future all-optical high capacity networks.

Although a specific two-contact SP-LD has been described, there may be some variation in the type of SP-LD which might be used in an embodiment of the present invention. For instance, it might be found that a DFB laser is preferred. However, in general, DFB devices are more expensive to fabricate, and it is therefore expected that a Fabry-Perot device would be preferred.

An important aspect of the SP-LD 1 as described above is the use of a dopant, this being zinc in the embodiment described, to reduce the carrier lifetime in the absorbing region 3 relative to the gain region 2. Other techniques for selective suppression might be used, these including for instance proton bombardment. However, they may be found to be disadvantageous in other ways, such as in producing defects. These can propagate, and could be expected to reduce the life span of a device. It is not thought that zinc diffusion would have a comparable effect, at least up to certain concentrations.

Also, where a fabrication technique as described above is applied, the diffusion step may be carried out in different ways. As described, however, the object of the diffusion step is to bring zinc into a buried heterostructure laser diode to the level of the active layer but not below, this being in the absorbing region 3 only of a device.

Zinc concentration levels in the device will affect the performance of the SP-LD 1 in use, for instance in terms of self-pulsation frequency, and this should be borne in mind in fabricating a device. In general, fabrication techniques used in producing a SP-LD 1 for use in a system according to the present invention might involve other dopant diffusion steps than the ones described, but have the same end result.

Another aspect of the SP-LD 1 which may also be altered is the supply of bias to the absorbing region 3 as well as to the gain region 2. It is also not essential for the SP-LD 1 to have an active layer made of InGaAsP. Thus, this active layer could be made of any suitable III–V compound having a direct bandgap.

In addition, this technique could be used at much higher clock frequencies with opimisation of material processing and device structure.

We claim:

1. A semiconductor laser diode for use in an optical clock extraction system operating at high signal bit rates, the laser diode comprising a self-pulsating device having a region of saturable absorption coupling with a region of relatively high gain, wherein the carrier lifetime in the saturable absorption region is lower that in the gain region.

2. A laser diode as claimed in claim 1, wherein the carrier lifetime in the saturable absorption region is selectively reduced with respect to that in the gain region.

3. A laser diode as claimed in claim 2, wherein the carrier lifetime in the saturable absorption region is selectively reduced by selective diffusion of a dopant into the absorption region.

4. A laser diode as claimed in claim 3, wherein the dopant is zinc.

5. A laser diode as claimed in claim 3, wherein the selective diffusion of dopant is carried out such that dopant is present in the active layer of the device but not in the material of the device between the active layer and an n-side electrical contact to the device.

6. A laser diode as claimed in claim 1, wherein the diode comprises a Fabry-Perot structure.

7. A laser diode as claimed in claim 1, wherein the laser diode has a self-pulsation frequency of at least 5 GHz.

8. A laser diode as claimed in claim 1, further comprising frequency control means for controlling the self-pulsation frequency of the diode so that the self-pulsation frequency can be controllably varied over a frequency range.

9. A laser diode as claimed in claim 8, wherein the frequency control means comprises a variable gain current supply to a gain region of the diode.

10. A laser diode as claimed in claim 8, wherein said frequency range covers a frequency change of at least 1 GHz.

11. A laser diode as claim in claim 10, wherein said frequency range covers a frequency change of at least 2 GHz.

12. A laser diode as claimed in claim 1, wherein the overall length of the diode lies in the range of from 250 μm to 500 μm.

13. A laser diode as claimed in claim 12, wherein the length of the saturable absorption region lies in the range of from 25μm to 40μm.

14. A laser diode as claim in claim 13, wherein the overall length of the diode is 500 μm, the length of the saturable absorption region is 25 μm, and said frequency range comprises at least the range of from 3.2 GHz to 5.2 GHz.

15. A laser diode as claimed in claim 12, wherein the overall length of the diode is 250 μm, the length of the saturable absorption region is 40 μm, and said frequency range comprises at least the range from 0.8 GHz to 3.5 GHz.

16. A laser diode as claimed in claim 1, wherein the laser diode includes an active layer of a III–V compound having a direct bandgap.

17. A laser diode as claimed in claim 1, wherein the laser diode includes an active layer of InGaAsP.

18. An optical clock extraction system comprising a self-pulsating laser diode whose output pulsation rate will lock onto a clock component of an input data signal over a significant range of frequencies of such a clock component, the range extending to a relatively high frequency, wherein the self-pulsating laser diode is as claimed in claim 1.

19. A system as claimed in claim 18, further including a means for controlling said range wherein said range extends to a frequency of the order of 5 GHz or greater.

20. A system as claimed in claim 18, the system being adapted for operation on digital optical input data having a significant clock component.

21. An optical signal processing system for processing an optical signal having a clock component, the system comprising means for inputting at least a-portion of the optical signal to an optical clock extraction device, and means for inputting a clock output of the optical clock extraction device and at least a portion of the optical signal to an optical signal processing device which processes said optical signal by means of said clock output, wherein the optical clock extraction device is constituted by a laser diode as claimed in claim 1.

22. A system as claimed in claim 21, wherein the clock output is combined with said at least a portion of the optical signal and the combination is supplied to an optical thresholding device.

23. An optical clock extraction system for extracting a clock signal from a NRZ digital optical input signal, the system comprising a NLOA and a SP-LD, the NLOA having an input port for receiving the input signal, the output of the NLOA, is use, being supplied to the SP-LD, the output pulsation rate of the SP-LD providing the clock signal, wherein the SP-LD is a laser diode as claimed in claim 1.

24. A laser diode as claimed in claim 1, wherein the carrier lifetime in the saturable absorption region is selectively reduced with respect to that in the gain region by increasing the number of recombination centres in the absorption region.

* * * * *